United States Patent [19]
Naruke et al.

[11] Patent Number: 6,166,958
[45] Date of Patent: Dec. 26, 2000

[54] SEMICONDUCTOR MEMORY DEVICE, METHOD FOR MANUFACTURING THE SAME, AND METHOD FOR CONTROLLING THE SAME

[75] Inventors: Kiyomi Naruke, Sagamihara; Shinichi Maekawa, Kanagawa-ken, both of Japan

[73] Assignee: Kabushiki Kaisha Toshiba, Kawasaki, Japan

[21] Appl. No.: 09/349,929

[22] Filed: Jul. 8, 1999

[30] Foreign Application Priority Data

Jul. 9, 1998 [JP] Japan .................................. 10-194529
Aug. 25, 1998 [JP] Japan .................................. 10-239050

[51] Int. Cl.$^7$ .................................................. G11C 16/04
[52] U.S. Cl. ............................. 365/185.24; 365/185.05; 257/324; 257/326
[58] Field of Search ........................ 365/185.24, 185.05, 365/185.18; 257/324, 326, 315, 316

[56] References Cited

U.S. PATENT DOCUMENTS 5,424,979 6/1995 Morii ....................................... 257/315
5,496,753 3/1996 Sakurai et al. ........................... 257/324

*Primary Examiner*—Vu A. Le
*Attorney, Agent, or Firm*—Finnegan, Henderson, Farabow, Garrett & Dunner, L.L.P.

[57] ABSTRACT

There is disclosed a memory cell which has a diffusion layers constituting source/drain areas formed on a p-type silicon substrate surface, and a channel area formed between the diffusion layers. Above the channel area, an insulating film of a laminated structure is formed of a silicon oxide film, a silicon nitride film and a silicon oxide film. A gate electrode is formed on the upper surface of the insulating film of the laminated structure. The gate electrode is used as a word line. Moreover, an interlayer insulating film is formed between the diffusion layer and the gate electrode. By injecting hot electrons from the substrate to the silicon nitride film in the insulating film of the laminated structure, data is written. The silicon nitride film and the diffusion layer are partially overlapped in a vertical direction, and an offset portion is disposed between the silicon nitride film and the diffusion layer.

8 Claims, 24 Drawing Sheets

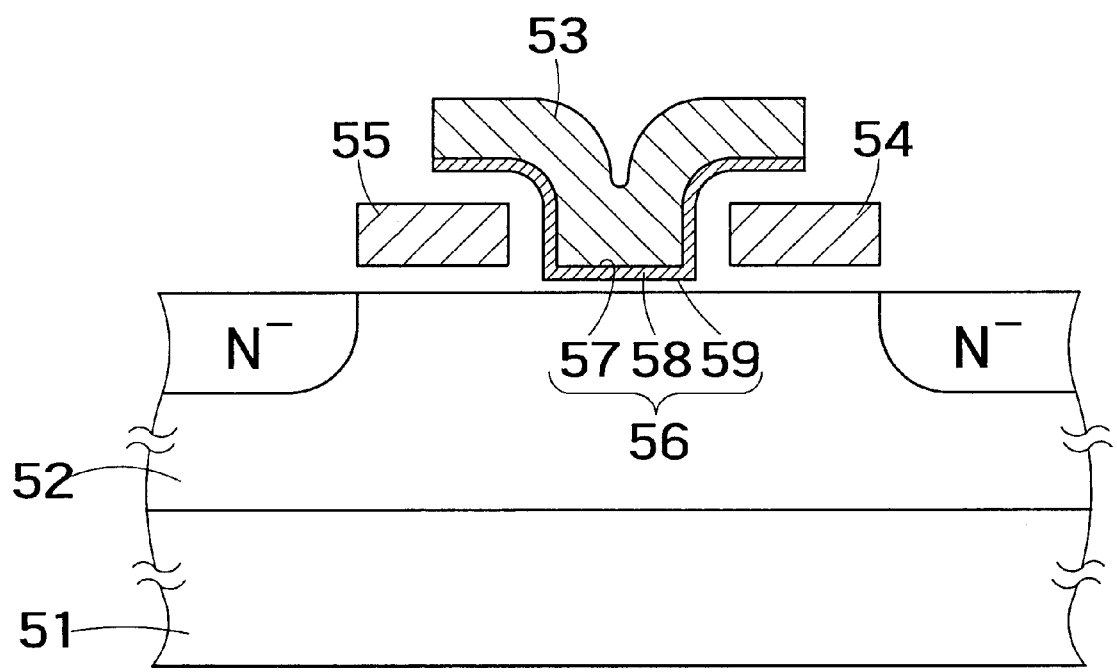
F I G. 1

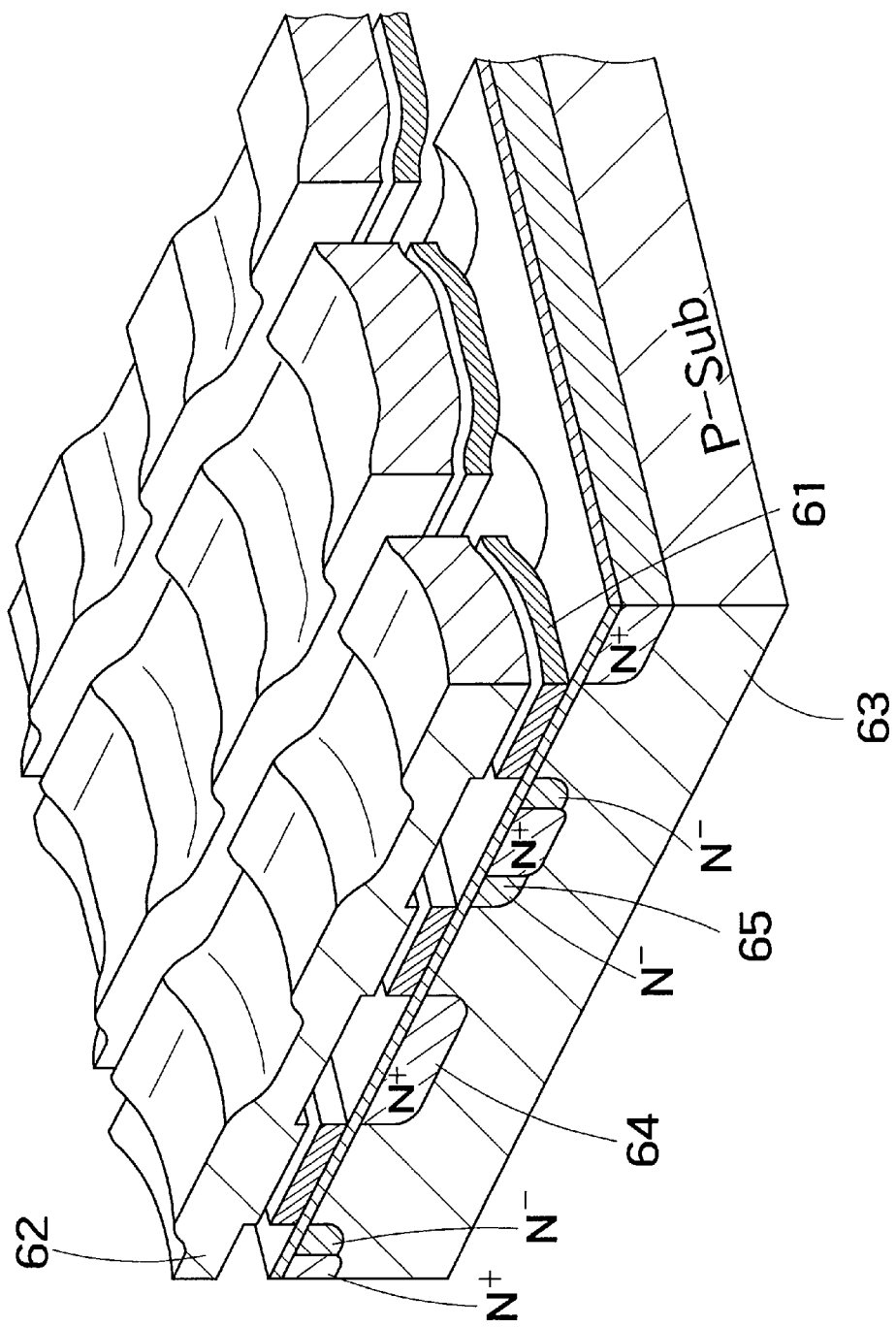
F I G. 2

VOLTAGE DURING READING
CONVENTIONAL MASK ROM CELL ARRAY

| CELL | SG1 | SG2 | SG3 | SG4 | Gn | G1~Gn-1 Gn+1~Gm | SC1 | SC2 | SC3 | DC1 | DC3 | DC2 |
|---|---|---|---|---|---|---|---|---|---|---|---|---|
| 1a | Vdd | Vdd | Vdd | Vdd | GND | GND | GND | Vdd | Vdd | GND | Vdd | Vdd |
| 1b | GND | Vdd | Vdd | Vdd | GND | GND | Vdd | GND | GND | Vdd | GND | Vdd |
| 1c | Vdd | GND | Vdd | Vdd | GND | GND | GND | GND | Vdd | Vdd | GND | Vdd |
| 1d | Vdd | GND | GND | Vdd | GND | GND | Vdd | GND | GND | Vdd | GND | Vdd |

F I G. 4

VOLTAGE DURING WRITING TO CONVENTIONAL EPROM CELL ARRAY

| CELL | SG1 | SG2 | SG3 | SG4 | Gn | G1~Gn-1 Gn+1~Gm | SC1 | SC2 | SC3 | DC1 | DC2 | DC3 | DC2 |
|------|-----|-----|-----|-----|-----|-----------------|-----|-----|-----|-----|-----|-----|-----|
| 1a | Vdd | Vdd | Vdd | Vpg | GND | GND | GND | Vpd | Vpd | GND | Vpd | Vpd |
| 1b | GND | Vdd | Vdd | Vpg | GND | GND | Vpd | GND | GND | Vpd | GND | GND |
| 1c | Vdd | Vdd | Gnd | Vpg | GND | GND | GND | Vpd | Vpd | GND | Vpd | Vpd |
| 1d | Vdd | GND | Vdd | Vpg | GND | GND | Vpd | GND | GND | Vpd | GND | Vpd |

F I G. 5

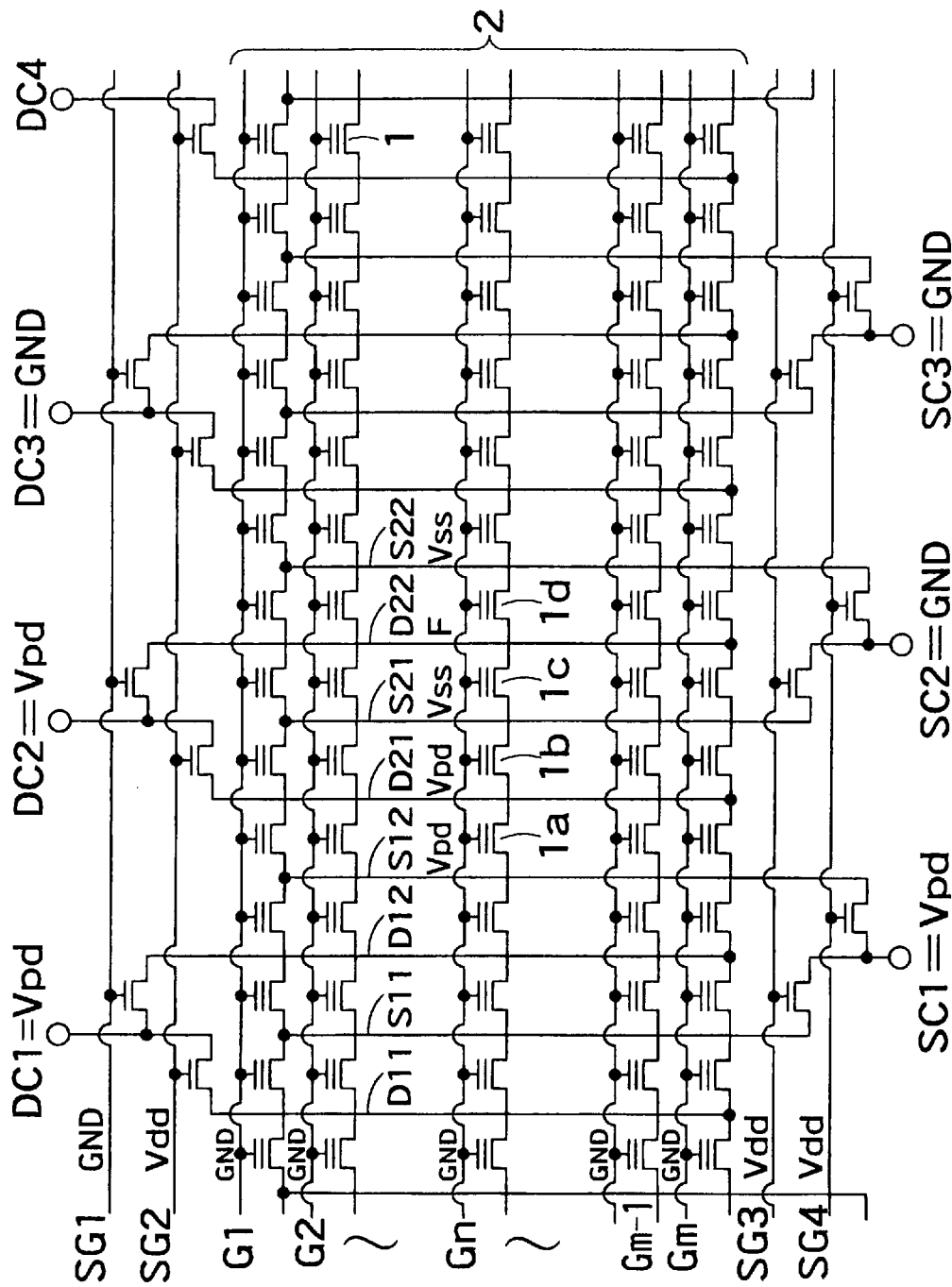
F I G. 6

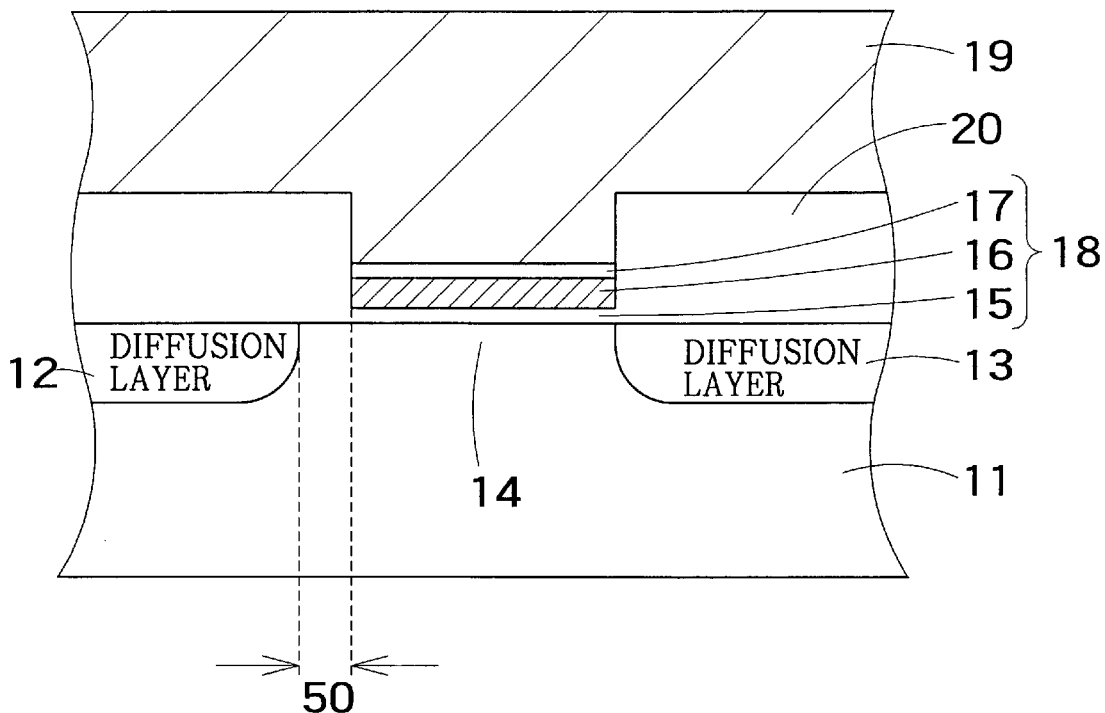
F I G. 9
|  | DIFFUSION LAYER 13 | DIFFUSION LAYER 12 | GATE ELECTRODE |
|---|---|---|---|
| ERASING | 0V | 0V | 10V |
| WRITING | 5V | 0V | 6V |
| READING | 0V | 1.5V | 3.3V |
F I G. 10

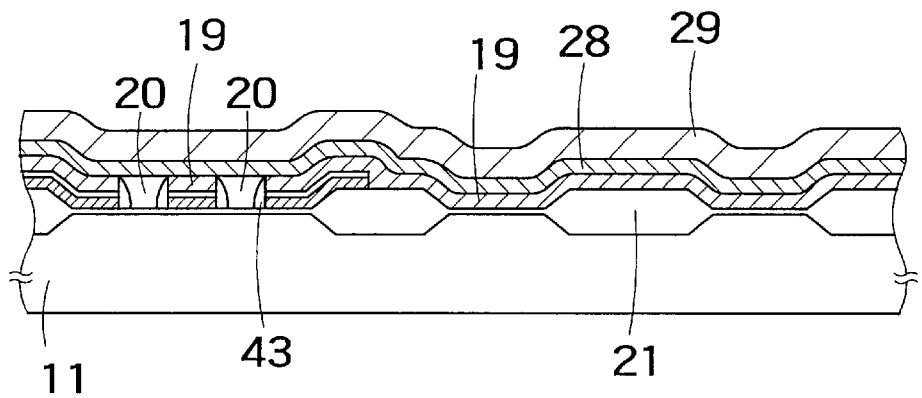
F I G. 15A
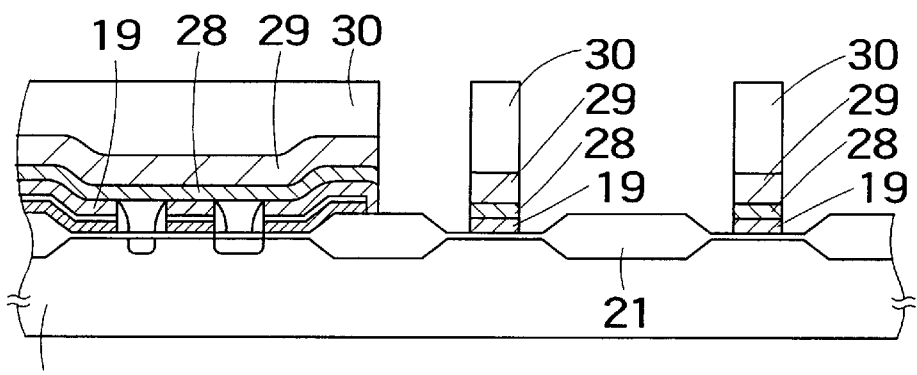
F I G. 15B
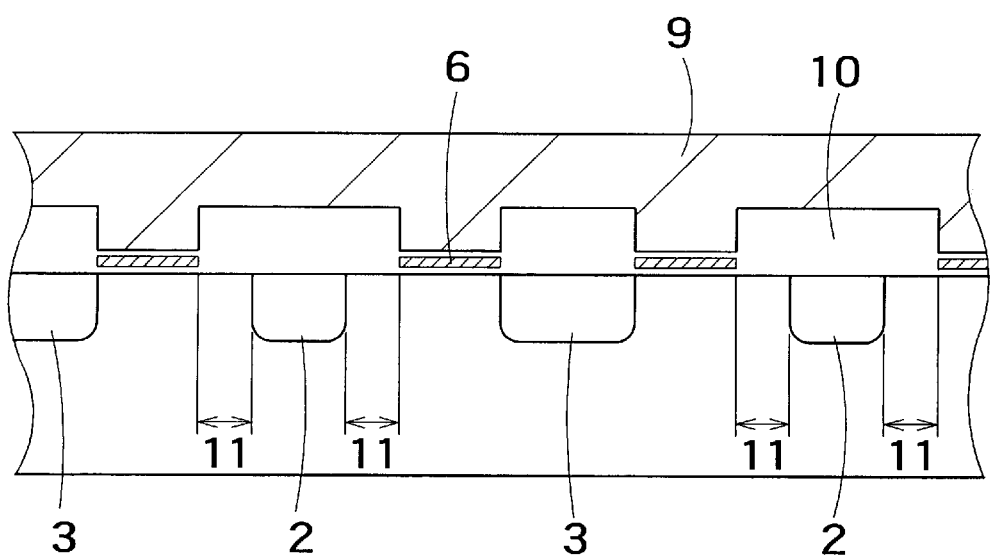
F I G. 16

VOLTAGE DURING WRITING TO EPROM CELL ARRAY OF THE PRESENT EMBODIMENT

| CELL | SG0 | SG1 | SG2 | SG3 | SG4 | SG5 | Gn | G1~Gn-1;Gn+1~Gm | SC1 | SC2 | SC3 | DC1 | DC2 | DC3 |
|------|-----|-----|-----|-----|-----|-----|-----|-----------------|-----|-----|-----|-----|-----|-----|
| 1a | GND | Vdd | Vdd | Vdd | Vdd | GND | Vpg | GND | GND | Vpd | Vpd | Vpd | Vpd | Vpd |
| 1b | Vdd | GND | Vdd | Vdd | Vdd | GND | Vpg | GND | Vpd | GND | Vpd | Vpd | GND | GND |
| 1c | Vdd | GND | Vdd | Vdd | Gnd | Vdd | Vpg | GND | GND | GND | Vpd | GND | GND | Vpd |
| 1d | Gnd | Vdd | Vdd | Vdd | GND | Vdd | Vpg | GND | Vpd | Vpd | GND | Vpd | Vpd | GND |

F I G. 18

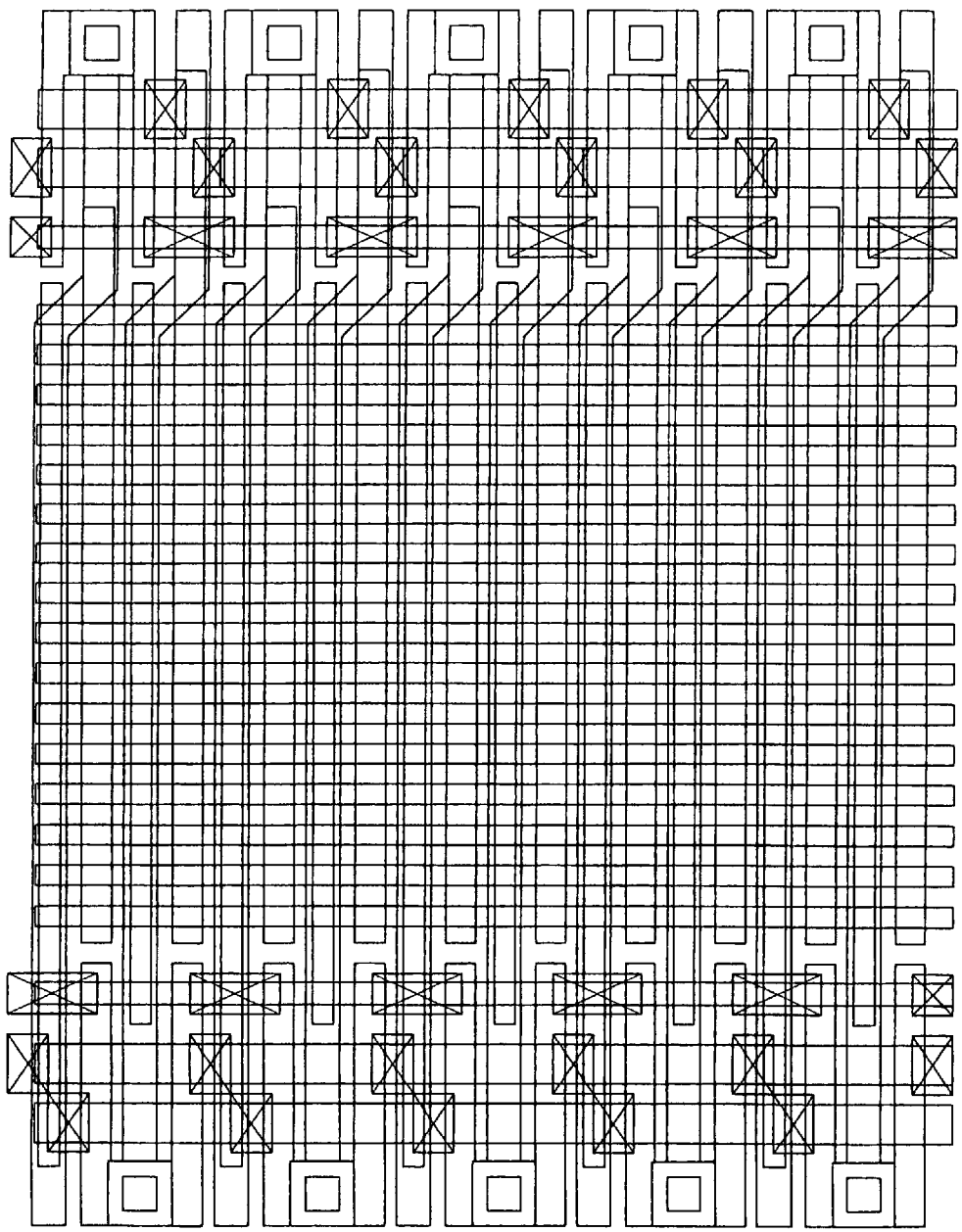
F I G. 20

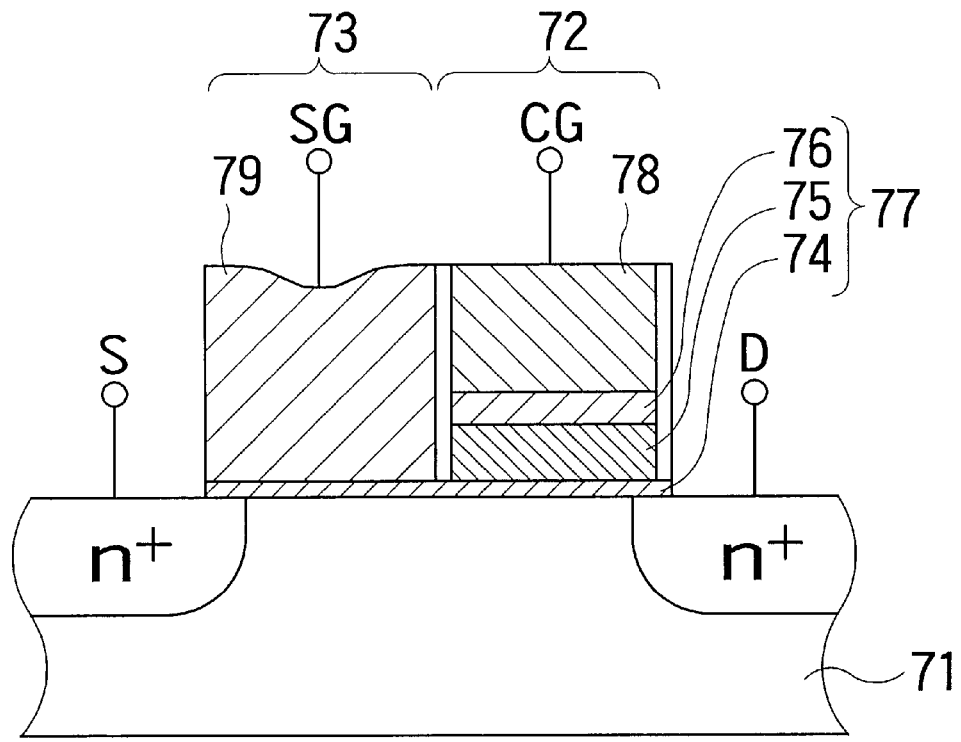
F I G. 21A
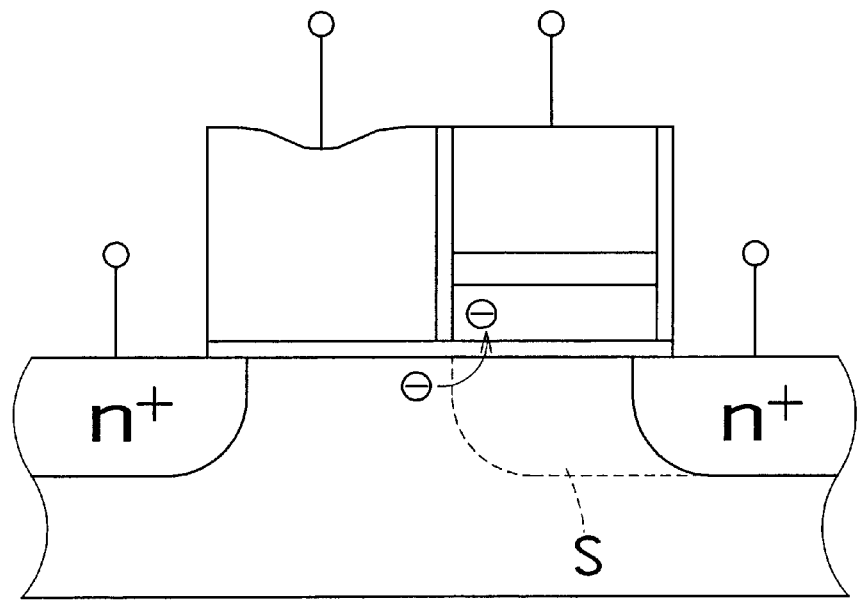
F I G. 21B

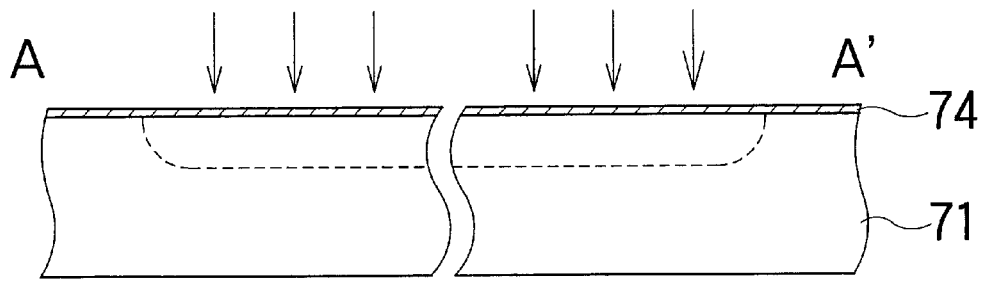
F I G. 23A
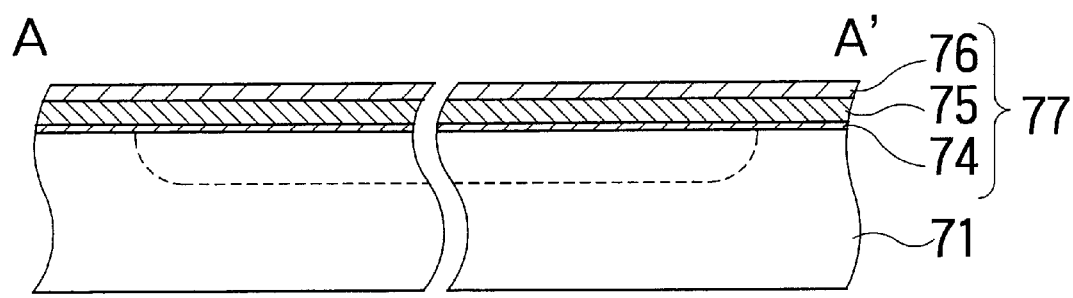
F I G. 23B
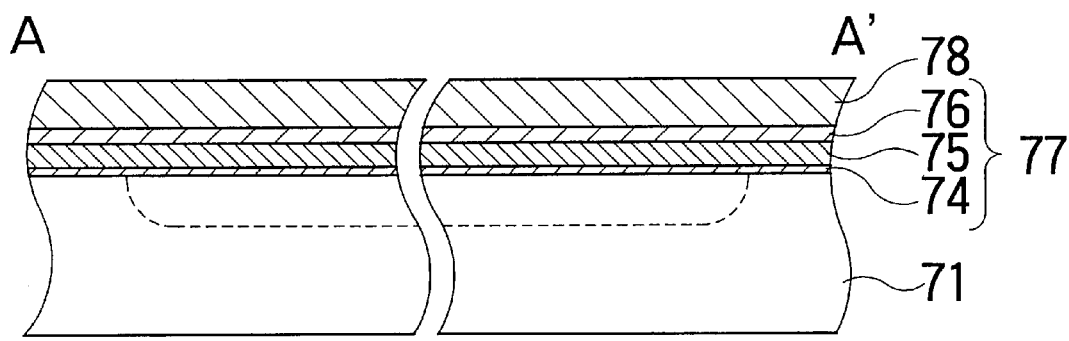
F I G. 23C

|  | DRAIN | SOURCE | SELECTING GATE | CONTROL GATE |
|---|---|---|---|---|
| WRITING | SELECTING CELL | 5.0V | 0V | 1.5V | 3.0V |
| WRITING | NON-SELECTING CELL1 | 5.0V | 0V | 3.0V | 3.0V |
| WRITING | NON-SELECTING CELL2 | 0V | 0V | 1.5V | 3.0V |
| READING | SELECTING CELL | 1.5V | 0V | 3.0V | 0V |
| READING | NON-SELECTING CELL1 | 1.5V | 0V | 3.0V | 3.0V |
| READING | NON-SELECTING CELL2 | 0V | 0V | 3.0V | 0V |

F I G. 25

SEMICONDUCTOR MEMORY DEVICE, METHOD FOR MANUFACTURING THE SAME, AND METHOD FOR CONTROLLING THE SAME

BACKGROUND OF THE INVENTION

1. Field of the Invention

The present invention relates to a semiconductor memory device capable of electrically rewriting, particularly to a technique for forming a memory cell with a fine structure.

2. Related Background Art

FIG. 1 is a view showing a sectional structure of a cell of a conventional M(O)NOS type EEPROM. A memory cell of FIG. 1 has a memory cell transistor 53 formed on the upper surface of a p-type well area 52 on an n-type silicon substrate 51, and first and second selecting transistors 54 and 55. A gate insulating film 56 of the memory cell transistor 53 has a laminated structure constituted of a silicon oxide film 57, a silicon nitride film 58, a tunnel oxide film 59, and the silicon nitride film 58 is utilized as an electric charge accumulating layer of electrons injected through a direct tunnel from the substrate 52.

When data is written to the EEPROM having the structure as shown in FIG. 1, data are first erased from all the memory cells in a predetermined cell block. Specifically, a positive high voltage is applied to the p-type well area 52, and electrons are discharged to the p-type well area 52 from the silicon nitride film 58 through the direct tunnel, whereby all the memory cells are in normally on states.

Next, data is written to a desired memory cell. Specifically, by designating the first selecting transistor 54, a control gate of the memory cell transistor 53, and a bit line (not shown), an arbitrary memory cell is selected. The writing to the memory cell transistor 53 is performed by setting the bit line to a ground level, and applying a high voltage to the first selecting transistor 54 and the control gate 53, while the second selecting transistor 55 is turned off, whereby electrons are injected to the silicon nitride film 58 from the substrate 52 through the direct tunnel.

The control gate 53 of FIG. 1 is shared by a plurality of memory cells, and in order to avoid the writing of the data to a non-selected memory cell, the bit line of the non-selected memory cell is set to an intermediate voltage. Moreover, the second selecting transistor 55 is set to an off state so that no through current may flow from the bit line to a source side.

The EEPROM of FIG. 1 has the following problems (1) and (2):

(1) Since each memory cell requires two selecting transistors 54 and 55, a cell size is unavoidably enlarged, and it is difficult to enlarge a memory capacity.

(2) Since there is provided a structure in which the electric charge written to the silicon nitride film 58 passes toward the substrate by direct tunneling and a so-called electric charge falling easily occurs, a charge holding property is inferior.

As one technique for solving the above problems (1) and (2), a virtual ground array type EPROM or EEPROM is proposed.

FIG. 2 is a schematic sectional view of the virtual ground array type EEPROM, and FIG. 3 is a circuit diagram showing an inner configuration of the virtual ground array type EPROM.

In the virtual ground array type EEPROM or EPROM, as shown in FIG. 3, there is provided a memory cell array 2 in which a plurality of memory cells are arranged in a matrix manner. Control gates in the memory cells of the same row in the memory cell array 2 are connected in common to constitute a word line. Moreover, sources and drains of memory cells 1 adjacent to each other in a column direction are interconnected, and sources and drains of the same column are connected in common to constitute a column line.

As shown in FIG. 2, each memory cell 1 is provided with a floating gate 61 and a control gate 62, and in a lower semiconductor substrate 63, $n^+$ diffusion layer 64 and $n^-$ diffusion layer 65 are formed for use as a source area and a drain area. Specifically, the $n^+$ diffusion layer 64 forms the source area, and the $n^-$ diffusion layer 65 forms the drain area. Moreover, the floating gate 61 is formed to overlap the $n^+$ diffusion layer 64 and the $n^-$ diffusion layer 65.

When data is written to the EEPROM of FIG. 2, the source diffusion layer is set to a ground level, and a high voltage is applied to the word line and the drain diffusion layer. Thereby, hot electrons are injected to the floating gate 61 from the drain side.

For the non-selected cell adjacent to the source side of the selected cell, data writing is avoided by setting the drain diffusion layer to the ground level. Moreover, for the non-selected cell adjacent to the drain side of the selected cell, the data writing is avoided by setting the drain diffusion layer and the source diffusion layer to the same potential, whereby, program current is reduced.

The EEPROM of FIG. 2 has the following problems (3) and (4):

(3) During writing, a large amount of the program current having a mA level flows in a single unit of memory cell 1.

(4) For patterns to form diffusion layer wiring, selecting transistors, and the like, since voltage drop is relatively large, writing properties are deteriorated, and a dispersion of threshold voltage is also enlarged. Therefore, it is difficult to simultaneously write to multiple bias.

(5) Since there is provided a two-layer gate structure, the structure is complicated, and manufacturing processes also become complicated.

As described above, because of the problems (3) to (5), even when EEPROM circuit structure is of the virtual ground array type, good electric properties cannot be obtained. As a result, it becomes difficult to enlarge the memory capacity.

When data is erased from EPROM of FIG. 3, ultraviolet rays are radiated from above the semiconductor substrate, and electrons are discharged from the floating gate. Moreover, data is read from EPROM of FIG. 3 in the following procedure. For example, when data is read from a memory cell 1a of FIG. 3, all selection gates SG1 to SG4 are set to power supply voltage Vdd, a gate line Gn connected to the memory cell 1a is set to the power supply voltage Vdd, the other gate lines are set to ground voltage Vss, all source contacts on the left side from source contact SC1 are set to the ground voltage Vss, all source contacts on the right side from source contact SC2 are set to the power supply voltage Vdd, all drain contacts on the left side from drain contact DC1 are set to the ground voltage Vss, and all drain contacts on the right side from drain contact DC2 are set to the power supply voltage Vdd, so that "0" or "1" is distinguished in accordance with the amount of electric current flowing into the drain contact DC2.

Similarly, when data is read from memory cells 1b, 1c and 1d of FIG. 3, voltages as shown in FIG. 4 are applied to the selection gates SG1 to SG4, gate lines G1 to Gm, source contacts SC1 to SC3, and drain contacts DC1 to DC3, respectively.

On the other hand, data is written to EPROM of FIG. 3 in the following procedure. For example, when data is written to the memory cell 1a of FIG. 3, all the selection gates SG1 to SG4 are set to power supply voltage Vdd, the gate line Gn connected to the memory cell 1a is set to a voltage Vpd which is higher than the power supply voltage Vdd, the other gate lines are set to the ground voltage Vss, all the source contacts on the left side of the source contact SC1 are set to the ground voltage Vss, all the source contacts on the right side of the source contact SC2 are set to the voltage Vpd, all the drain contacts on the left side of the drain contact DC1 are set to the ground voltage Vss, and all the drain contacts on the right side of the drain contact DC2 are set to the voltage Vpd. In this state, electrons are injected to the floating gate from a channel section of the memory cell 1a. By the above-described operation, the threshold voltage of the memory cell 1 in which the electrons are injected to the floating gate can be set to be higher than the power supply voltage Vdd.

Similarly, a method of setting voltages when data is written to the memory cells 1b, 1c, and 1d of FIG. 3 is as shown in FIG. 5.

When data is written to EPROM of FIG. 3, there arises a problem that some of the source and drain lines are in floating states, which causes a possibility that data is written to the non-selected cells by mistake.

For example, FIG. 6 is a diagram showing voltages of the source and drain lines when data is written to the memory cell 1b. As shown in the drawing, the voltage Vpd is applied to drain line D21 of the memory cell 1b, and the ground voltage Vss is applied to source line S21, so that data is written to the memory cell 1b. In this case, drain line D22 adjacent to the right side of the source line S21 is in a floating (F) state. Therefore, data is probably written by mistake to the memory cell 1d until the source line S22 reaches the ground voltage Vss. Similarly, when data is written to the memory cell 1d, there is a possibility that data is written by mistake to the adjacent memory cell 1c.

Incidentally, there is proposed a so-called source side injection type EEPROM in which electrons are injected into the floating gate from the source side. FIG. 7 is a sectional view showing a basic structure of the source side injection type EEPROM.

The EEPROM of FIG. 7 has a structure in which a memory cell transistor 63 and a selecting transistor 64 are arranged adjacent to each other between a source area 61 and a drain area 62. The memory cell transistor 63 has a control gate 65 and a floating gate 66, and the selecting transistor 64 has a selection gate 67. The floating gate 66 is usually formed of poly-silicon.

During data (electron) writing, a high voltage is applied to the control gate 65, a predetermined voltage is applied between drain and source, and a voltage which is slightly higher than the threshold voltage of the selecting transistor 64 is applied to the selection gate 67. Thereby, electrons are injected to the floating gate 66 from the source side of the floating gate 66.

The operation principle is as follows:

In a writing bias state, the floating gate 66 becomes an intermediate voltage by coupling of the floating gate 66 and the control gate 65. A channel under the floating gate 66 requires a negative charge matching the potential of the floating gate 66, but a channel current is suppressed to be low by the selecting transistor 64. Therefore, a negative charge amount by a channel electron is insufficient. To compensate for this insufficiency, a deep depletion layer S is formed under the floating gate 66 so as to ionize a donor of substrate impurities.

Specifically, an energy level of Si substrate surface is deeply lowered. Then, an energy level of an oxide film on Si substrate under the floating gate 66 is also deeply lowered. Thereby, an energy barrier of Si oxide film is maintained.

In this state, an electron, which has penetrated into a channel area under the floating gate 66 through a channel of the selection gate 67 from the source area 61 without losing its energy, reaches an energy level higher than an energy level of a conductive band of the oxide film on the upper surface, and further advances. Subsequently, the electron flows along an electric field between the floating gate 66 and the substrate, flows beyond the energy barrier of the oxide film, and is injected to the floating gate 66.

On the other hand, the data (electron) is erased by grounding the control gate 65 and the selection gate 64, applying a voltage of about 12 V to the drain area 62, and extracting the electron to the drain area 62 from the floating gate 66 by F-N tunnel effect.

As described above, in EEPROM of FIG. 7, the program current is suppressed to be low by the selecting transistor 64 and the electron is injected along a traveling direction of the electron from the source side of the floating gate 66. Therefore, the EEPROM has a feature in which an electron injection efficiency is better than a usual hot electron injection in which electrons are injected from the drain side.

However, in the EEPROM of FIG. 7, the floating gate is formed of a conductive material such as poly-silicon. When the floating gate is formed of the conductive material, the floating gate causes capacity coupling with the control gate. Even if voltage is not directly applied to the floating gate, the voltage of the floating gate reaches an intermediate voltage between the voltage applied to the control gate and the ground voltage.

On the other hand, if the capacity coupling the floating gate and the control gate is small, the voltage of the floating gate is lowered; as a result, the electron injection efficiency deteriorates. Therefore, as shown in FIG. 8, it is necessary to enlarge the surface area of the floating gate as much as possible, so that a coupling ratio between the floating gate and the control gate becomes high. It is thus difficult to reduce the cell size, which obstructs high integration.

SUMMARY OF THE INVENTION

An object of the present invention is to provide a semiconductor memory device and manufacturing method thereof that it is possible to reduce current consumption and to enlarge memory capacity.

Another object of the present invention is to provide a semiconductor memory device in which wrong writing can securely be prevented without complicating an inner configuration.

Furthermore, another object of the present invention is to provide a semiconductor memory device in which electrons can be injected to a charge accumulating layer with a low voltage, electron injection efficiency is good, and cell size can be reduced, and a method of controlling the device.

According to the present invention, there is provided a semiconductor memory device comprising:

a first diffusion layer area and a first channel area formed in contact with each other in a direction substantially parallel to the upper surface of a semiconductor substrate;

a second channel area formed in contact with said first channel area in the direction substantially parallel to the upper surface of said semiconductor substrate;

a second diffusion layer area formed in contact with said second channel area in the direction substantially parallel to the upper surface of said semiconductor substrate;

a charge accumulating layer of a laminated structure formed on said first channel area;

an insulating layer formed on said charge accumulating layer; and a gate electrode formed on the upper surface of said charge accumulating layer and said insulating layer, a threshold voltage of said first channel area under said gate electrode being set to be higher than a threshold voltage of said second channel area under said gate electrode.

According to the present invention, since a silicon nitride film is used as the charge accumulating layer, substantially the same voltage as a voltage applied to a control gate can be applied to the silicon nitride film, and a program voltage applied to the control gate during data writing can be set to be low.

According to the present invention, there is provided a semiconductor memory device comprising:

a virtual ground type memory cell array in which a memory cell having a control gate and a floating gate is arranged in a row direction and a column direction in a matrix manner, control gates of the memory cells of the same row are connected in common to constitute a row line, sources of the memory cells of the same column are connected in common to constitute a source line, and drains of the memory cells of the same column are connected in common to constitute a drain line;

first to sixth selection gate lines;

a plurality of first source line selecting transistors having gate terminals connected in common to said first selection gate line to select the corresponding source lines, respectively;

a plurality of second source line selecting transistors having gate terminals connected in common to said second selection gate line to select the corresponding source lines, respectively;

a plurality of third source line selecting transistors having gate terminals connected in common to said third selection gate line to select the corresponding source lines, respectively;

a plurality of first drain line selecting transistors having gate terminals connected in common to said fourth selection gate line to select the corresponding drain lines, respectively;

a plurality of second drain line selecting transistors having gate terminals connected in common to said fifth selection gate line to select the corresponding drain lines, respectively; and a plurality of third drain line selecting transistors having gate terminals connected in common to said sixth selection gate line to select the corresponding drain lines, respectively, wherein one source line of the adjacent two source lines is connected to a source terminal of said corresponding first source line selecting transistor, and the other source line is connected to source terminals of said corresponding second and third source line selecting transistors, one drain line of the two adjacent drain lines is connected to the source terminal of said corresponding first drain line selecting transistor, and the other drain line is connected to the source terminals of said corresponding second and third source line selecting transistors, said first to third source line selecting transistors are controlled to be turned on/off so that no source line becomes a floating state during data writing to said memory cell, and said first to third drain line selecting transistors are controlled to be turned on/off so that no drain line becomes the floating state during data writing to said memory cell.

Here, "the first to sixth selection gate lines" correspond to selection gate lines SG0 to SG5, "the first source line selecting transistors" correspond to first source line selecting transistors Qs11 to Qs1n, "the second source line selecting transistors" correspond to second source line selecting transistors Qs21 to Qs2n, "the third source line selecting transistors" correspond to third source line selecting transistors Qs31 to Qs3n, "the first drain line selecting transistors" correspond to first drain line selecting transistors Qd11 to Qd1n, "the second drain line selecting transistors" correspond to second drain line selecting transistors Qd21 to Qd2n, and "the third drain line selecting transistors" correspond to third drain line selecting transistors Qd31 to Qd3n, respectively.

According to the present invention, since during the data writing, the electrons are injected to the silicon nitride film from the source side, the program current can be reduced. Even in the virtual ground array type constitution, the current consumption can be suppressed.

Moreover, since the electrons are injected to the silicon nitride film from the source side, the electrons can uniformly be trapped in the entire surface of the silicon nitride film, no fluctuation of threshold voltage occurs after the data writing; as a result, it is possible to improve a charge holding property.

Furthermore, according to the present invention, one line of the adjacent two source lines is connected to the second and third source line selecting transistors, and one line of the adjacent two drain lines is connected to the second and third drain line selecting transistors. Therefore, by controlling so as to allow one of the second and third source line selecting transistors to turn on and to allow one of the second and third drain line selecting transistors to turn on, there is no possibility that the source and drain lines are placed in the floating states even when data is written to any memory cell 1; as a result, wrong writing can securely be prevented.

Moreover, according to the present invention, there is provided a semiconductor memory device comprising:

a memory cell transistor formed on a semiconductor substrate and having a charge accumulating layer to which electrons from the semiconductor substrate can be injected;

a selecting transistor formed adjacent to said memory cell transistor and having a selection gate; and a source area and a drain area formed in the semiconductor substrate on opposite sides of said memory cell transistor and said selecting transistor, wherein during data writing, a voltage slightly higher than a threshold voltage of said selecting transistor is applied to said selection gate, and the electrons are injected to said charge accumulating layer from its side close to said source area, said memory cell transistor comprises a laminated film including an insulating film formed on the upper surface of the semiconductor substrate and a silicon nitride film formed on the upper surface of the insulating film, and a control gate formed on the upper surface of the laminated film, at least one of said silicon nitride film in said laminated film, and a vicinity of an interface of said insulating film and said silicon nitride film is utilized as said charge accumulating layer, each memory cell is provided with said memory cell transistor and said selecting transistor, and said memory cell transistor and said selecting transistor corresponding to each memory cell are connected by NAND logic.

According to the present invention, the laminated film is formed instead of the floating gate, at least one of the silicon nitride film in the laminated film, and the vicinity of the interface between the insulating film in the laminated film and the silicon nitride film is used as the charge accumulating layer, and the control gate and the selection gate are formed adjacent to each other to inject the electrons to the charge accumulating layer from the source side. Therefore, it is possible to raise the electron injection efficiency, while the cell size can be reduced. Moreover, since the electrons are injected to the charge accumulating layer from the source side, the voltage to be applied to the control gate or the like during the data writing can be lowered, and a highly withstanding voltage structure is unnecessary. Therefore, an element structure can be simplified, and it is possible to improve a manufacturing yield and to reduce a cost.

BRIEF DESCRIPTION OF THE DRAWINGS

FIG. 1 is a view showing a cell sectional structure of a conventional M(O)NOS type EEPROM.

FIG. 2 is a diagrammatic sectional view of a virtual ground array type EEPROM.

FIG. 4 is a voltage setting diagram of EPROM of FIG. 3 during reading.

FIG. 5 is a voltage setting diagram of EPROM of FIG. 3 during writing.

FIG. 6 is a diagram showing voltages of source and drain lines when data is written to a memory cell 1b.

FIG. 9 is a view showing a cell sectional structure of EEPROM of a first embodiment.

FIG. 10 is a voltage setting diagram of a memory cell of FIG. 1 during writing.

FIGS. 13a to 13d, 14a to 14d, and 15a to 15b are manufacturing process views of a second embodiment of the virtual ground array type EEPROM.

FIG. 16 is a view showing a sectional structure of a cell area formed by processes of FIGS. 13 to 15.

FIG. 18 is a voltage setting diagram of the EPROM of FIG. 17 during writing.

FIGS. 19 and 20 are pattern layout diagrams of the EPROM of FIG. 1.

FIGS. 21a and 21b are views showing a sectional structure of a fourth embodiment of a semiconductor memory device.

FIGS. 23a to 23c and 24a to 24c are views showing manufacturing processes of the EEPROM of FIG. 1.

FIG. 25 is a voltage setting diagram of the EEPROM of FIG. 21 during reading/writing.

DESCRIPTION OF THE PREFERRED EMBODIMENTS

Figure 3:
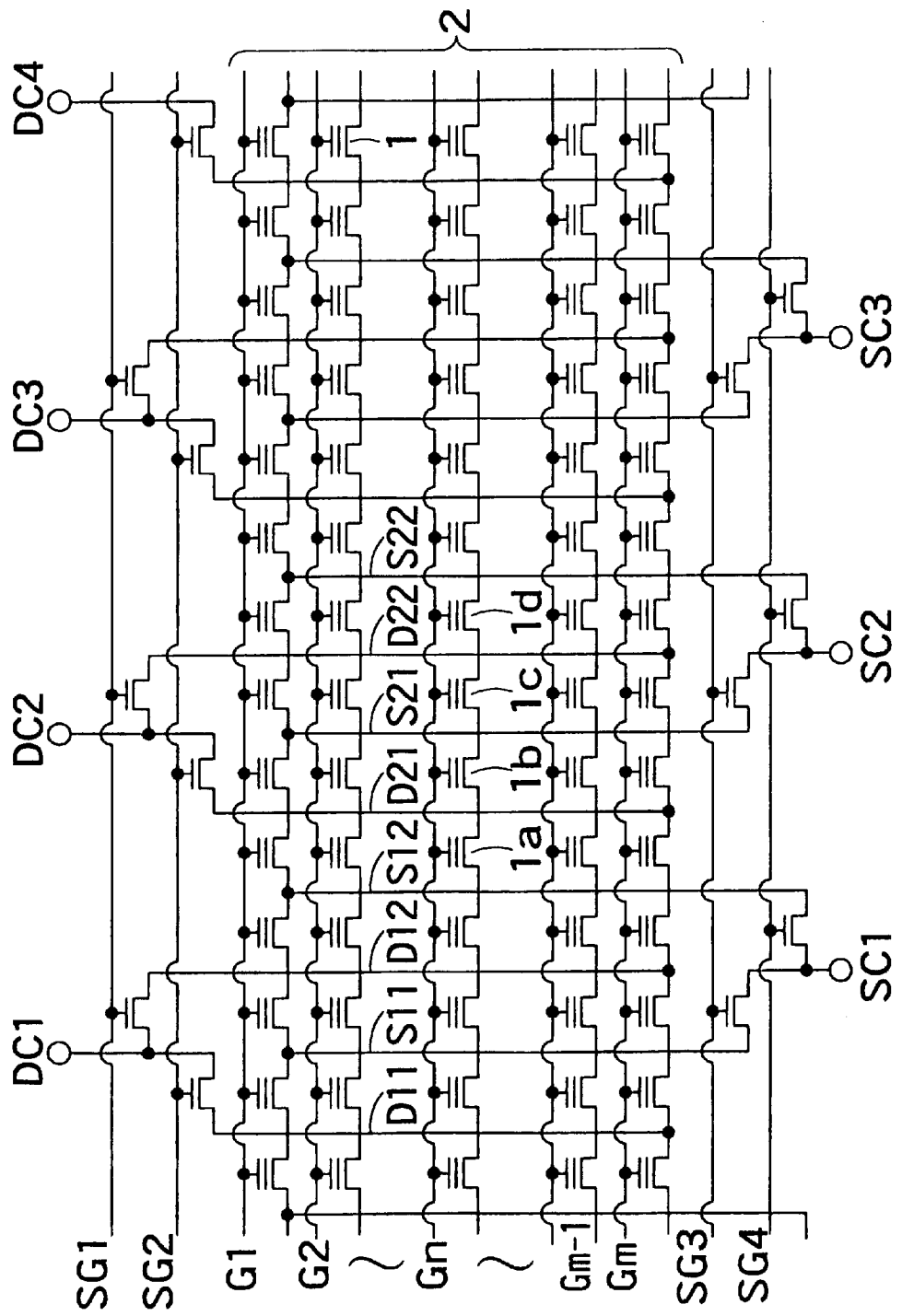
FIG. 3 is a circuit diagram showing an inner configuration of a virtual ground array type EPROM.
Figure 7A:
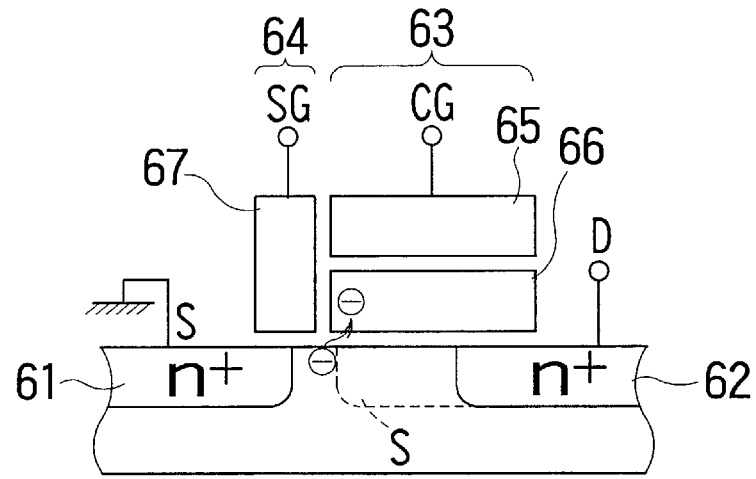
FIGS. 7a to 7c are sectional views showing a basic structure of a source side injection type EEPROM.
Figure 7B:
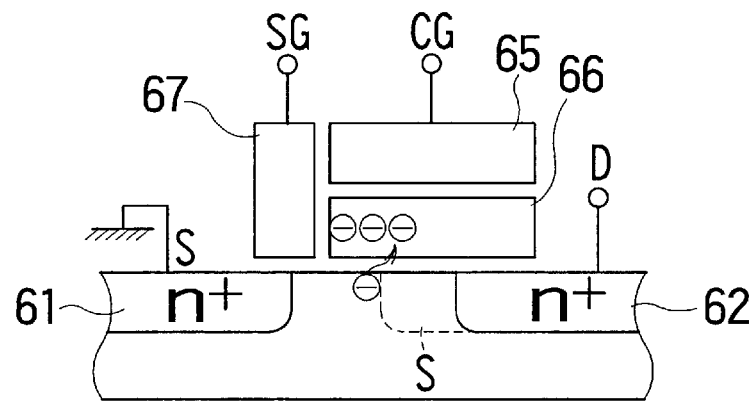
Figure 7C:
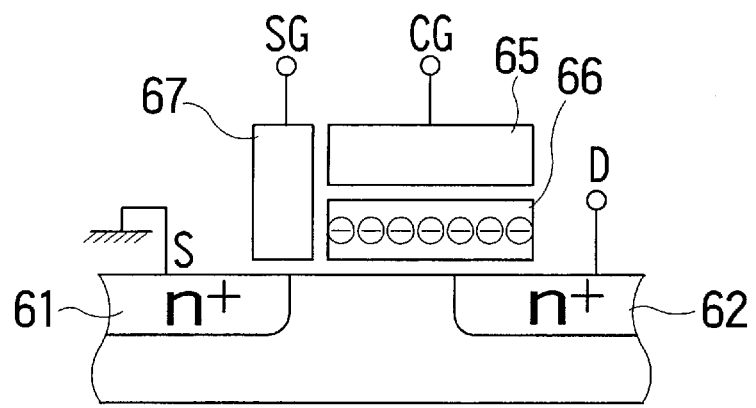
Figure 8:
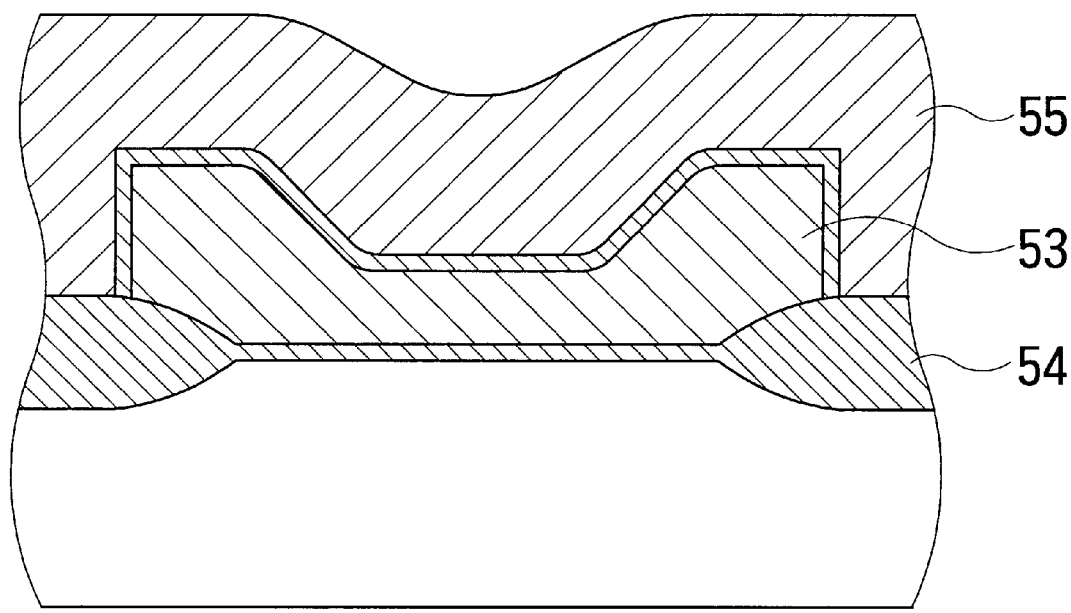
FIG. 8 is a view showing an example in which a coupling ratio of a floating gate and a control gate is raised.

A semiconductor memory device of the present invention will be described hereinafter in detail with reference to the drawings. As an example of the semiconductor memory device, a virtual ground array type EEPROM will be described hereinafter.

First Embodiment

FIG. 9 is a view showing a cell sectional structure of EEPROM of a first embodiment. In a semiconductor memory device of the first embodiment, a plurality of EEPROM cells of FIG. 9 (hereinafter referred to as the memory cells) are used to form a virtual ground array type constitution in the same manner as in FIG. 3.

More specifically, a plurality of memory cells are arranged in a matrix manner, control gates in the memory cells of the same row are connected in common to constitute word lines $WL_{i+1}$ to $WL_{i-m}$, and sources and drains in the memory cells of the same column are connected in common to constitute a column line.

As shown in FIG. 9, each of memory cells 1 constituting EEPROM has diffusion layers 12, 13 forming a source/drain area formed on the upper surface of a p-type silicon substrate 11, and a channel area 14 formed between the diffusion layers 12 and 13. Above the channel area 14 formed is an insulating film 18 of a laminated structure constituted of a silicon oxide film 15, a silicon nitride film 16 and a silicon oxide film 17. A gate electrode 19 is formed on the upper surface of the insulating film 18 of the laminated structure. The gate electrode 19 is used as a word line. Moreover, an interlayer insulating film 20 is formed between the diffusion layers 12, 13 and the gate electrode 19.

Data is written by injecting hot electrons from the substrate to the silicon nitride film 16 in the insulating film 18. The silicon nitride film 16 and the diffusion layer 13 are partially overlapped in a vertical direction, while an offset portion 50 is formed between the silicon nitride film 16 and the diffusion layer 12.

In each memory cell 1 constituting the EEPROM of the first embodiment, in cases where data is written and read, the source and the drain are reversed. That is, during data writing, the diffusion layer 12 of FIG. 9 is used as the source, and the diffusion layer 13 is used as the drain. During data reading, the diffusion layer 13 is used as the source, and the diffusion layer 12 is used as the drain.

A threshold voltage of the channel area formed below the silicon nitride film 16 is set to be higher than a threshold voltage of the channel area formed below the offset portion 50.

Data writing principle of the memory cell 1 of FIG. 9 will next be described. During data writing, as shown in FIG. 10, the diffusion layer 13 is set to 5 V, the diffusion layer 12 is set to 0 V, and the gate electrode (word line) 19 is set to 6 V. Because only an electric force line from a gate side surface acts to the offset portion 50 of FIG. 9, and gate control is weak, only a weak inverse layer is formed. On the other hand, a depletion layer is formed in the channel area 14 right under the silicon nitride film 16. A reason why the depletion layer is formed is that the channel area 14 is subjected to strong gate control and tries to form the inverse layer, but the offset portion 50 is a weak inverse layer, and supply of channel electrons from the source side is suppressed.

Therefore, a high electric field area is formed in the vicinity of an edge of the depletion layer on the side of the diffusion layer 12, and the electrons entering the high electric field area through the weak inverse layer of the offset portion 50 from the source side form hot electrons. The hot electrons are drawn toward the gate electrode 19, and trapped into the silicon nitride film 16.

On the other hand, during data reading, as shown in FIG. 10, the diffusion layer 12 is set to 1.5 V, the diffusion layer 13 is set to 0 V, and the gate electrode 19 is set to 3.3 V. Thereby, the depletion layer is spread over to the offset portion 50 from the diffusion layer 12, and based on whether current flows toward the diffusion layer 13 from the diffusion layer 12, it is determined whether or not the electrons are injected into the silicon nitride film 16.

Figure 11A:
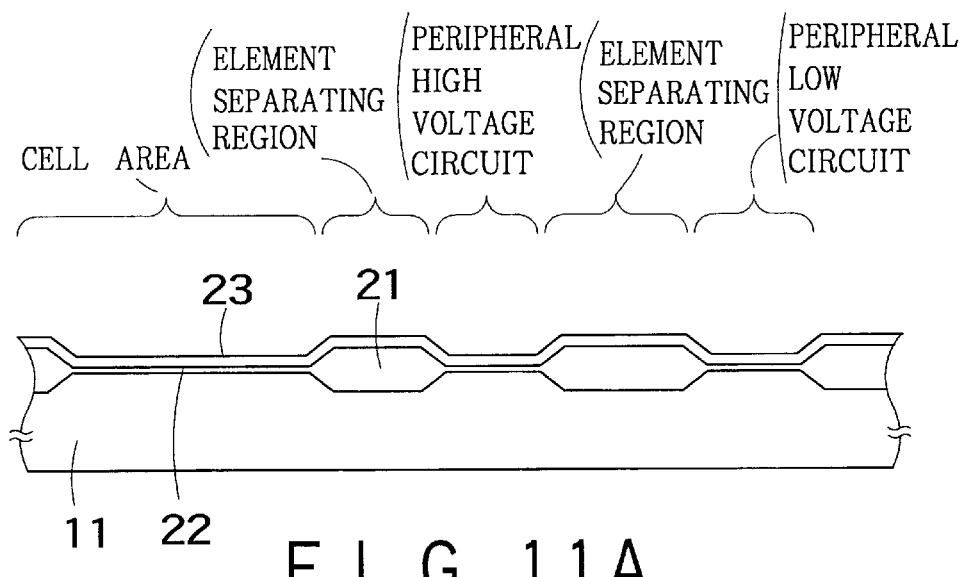
FIGS. 11a to 11c and 12a to 12d are manufacturing process views of the first embodiment of the EEPROM of FIG. 9.

FIGS. 11 and 12 are manufacturing process diagrams of the first embodiment of EEPROM of FIG. 9. First, as shown in FIG. 11a, by a known LOCOS method, an about 600 nm-thick field oxide film 21 is formed in an element separating area on the p-type silicon substrate 11. An area surrounded with the field oxide film 21 forms a cell area. Subsequently, after the surface of the p-type silicon substrate 11 on the cell area is exposed, an about 15 nm-thick silicon oxide film 22 is formed on the surface by thermal oxidation method. Thereafter, by CVD method, an about 50 nm-thick poly-silicon layer 23 is formed on the upper surface of the substrate.

Figure 11B:
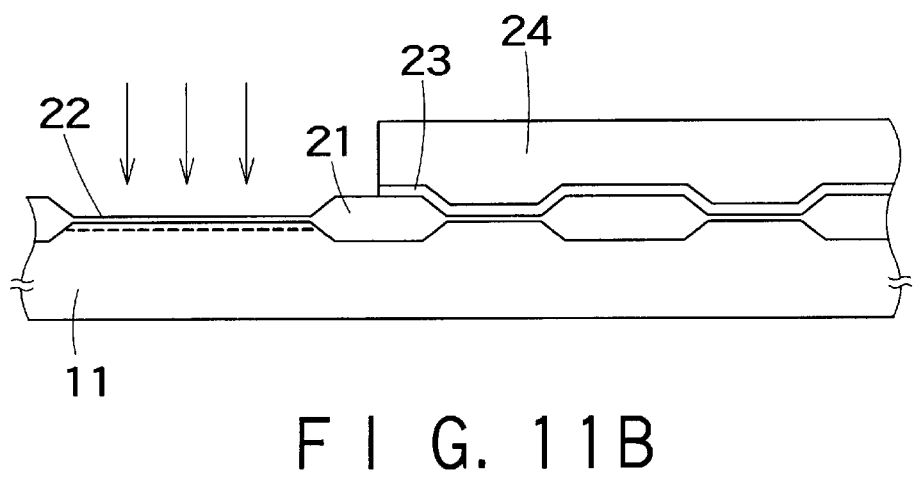

Subsequently, as shown in FIG. 11b, except the cell area, a resist 24 is formed on the poly-silicon layer 23. Next, the resist 24 is used as a mask, and the polysilicon layer 23 in the cell area is etched/removed with RIE. Subsequently, in the cell area, channel ion injection for controlling the threshold voltages is performed.

Subsequently, after the resist 24 is removed, the poly-silicon layer 23 is used as the mask to etch/remove the silicon oxide film 22 with diluted HF, and the surface of the silicon substrate 11 on the cell area is exposed.

Figure 11C:
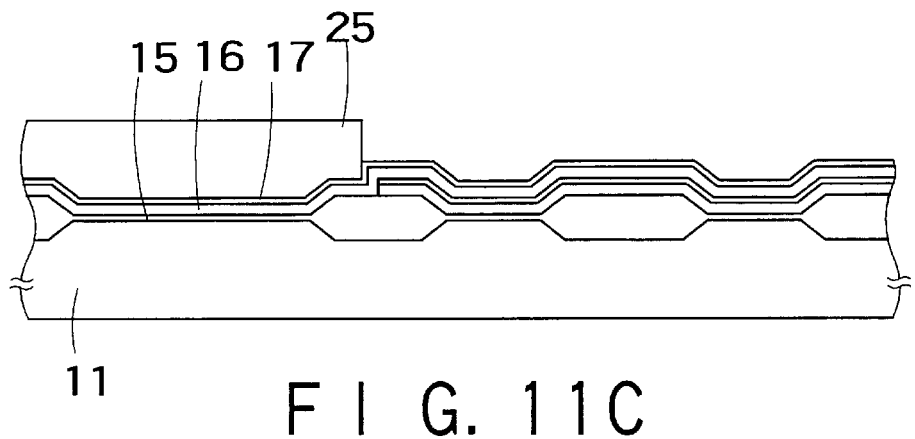

Subsequently, as shown in FIG. 11c, after an about 5 nm-thick silicon oxide film 15 is formed by the thermal oxidation method, an about 5 nm-thick silicon nitride film 16 is formed. Next, an about 4 nm-thick silicon oxide film 17 is formed on the surface of the silicon nitride film 16. Subsequently, a resist 25 is formed on the silicon oxide film 17 except a peripheral circuit forming area.

The resist 25 is then used as the mask to remove the silicon oxide film 15, silicon nitride film 16, silicon oxide film 17 and poly-silicon layer 23 by RIE. Subsequently, the channel ion injection for controlling threshold voltages of peripheral transistors is performed. After then, the silicon oxide film 22 is removed by etching using diluted HF.

Figure 12A:
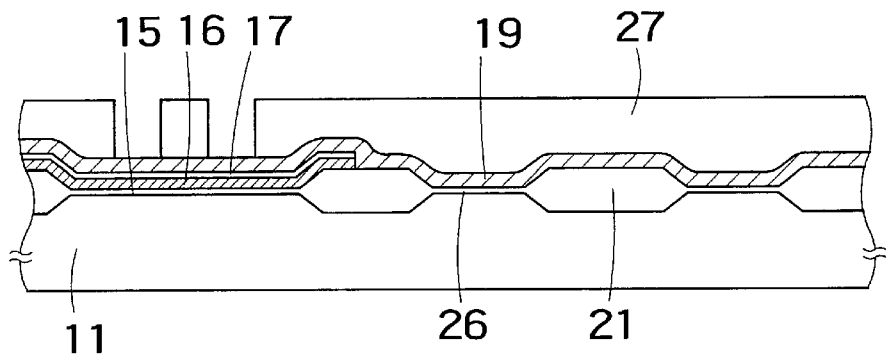

Subsequently, as shown in FIG. 12a, after an about 15 nm-thick silicon oxide film 26 is formed by the thermal oxidation method, an about 100 nm-thick poly-silicon layer 19 is formed by the CVD method. On the poly-silicon layer 19 formed is a resist 27 in which the source/drain area in the cell area is opened.

Figure 12B:
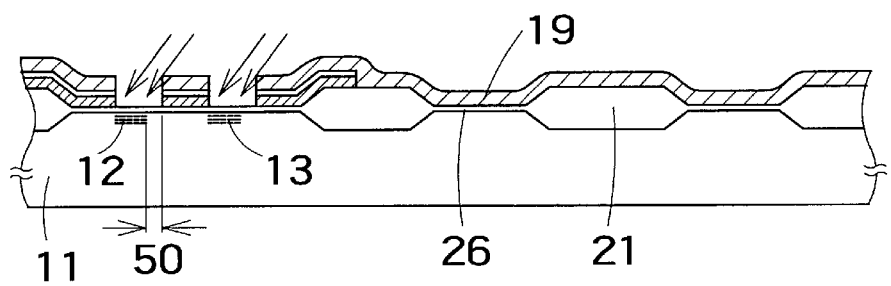

Subsequently, as shown in FIG. 12b, the resist 27 is used as the mask to remove the poly-silicon layer 19, silicon oxide film 17 and silicon nitride film 16 by RIE. Next, after the resist 27 is removed, the poly-silicon layer 19 is used as the mask to perform angle ion injection of arsenic from an oblique direction (e.g., direction of 45 degrees). Thereby, formed are the diffusion layers 12, 13 and offset portion 50 which have a self align structure for the poly-silicon layer 19.

Figure 12C:
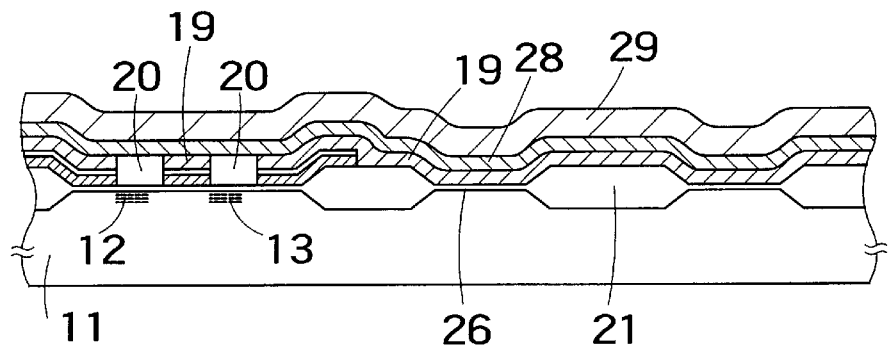

Subsequently, as shown in FIG. 12c, a silicon oxide film 10 is formed by the CVD method. Specifically, for example, etching-back by RIE is performed, and the silicon oxide film 10 is embedded in a space portion of the polysilicon layer 19. Subsequently, after an about 50 nm-thick poly-silicon layer 28 is formed by the CVD method, on the upper surface of the layer, an about 15 nm-thick WSi film 29 is formed by the CVD method.

Figure 12D:
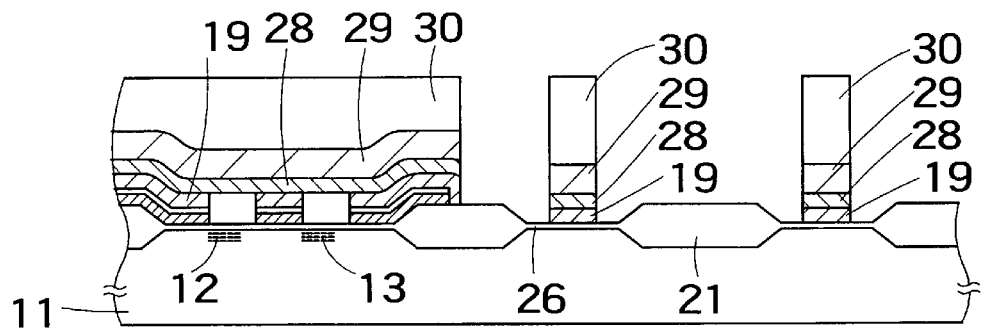

Subsequently, as shown in FIG. 12d, after a transistor resist pattern 30 for the transistor is formed in the cell area, the resist 30 is used as the mask to remove the WSi film 29, poly-silicon layer 28 and polysilicon layer 19 by RIE. Similarly, after the transistor in the peripheral area and a resist pattern of the wiring area are formed, the resist 30 is used as the mask to perform RIE, so that the WSi film 29 and poly-silicon layer 28 are removed by etching.

Subsequently, in the same manner as usual LSI manufacturing method, after ion injection is performed to form source/drain diffusion layers of peripheral transistors, an about 400 nm-thick BPSG film is deposited as an interlayer film, then thermal treatment is performed, for example, at 850° C. Subsequently, after a contact hole is formed, a barrier metal layer is formed on an inner wall of the contact hole, and a metal material (e.g., Al—Si—Cu) is embedded in the contact hole to perform patterning. Subsequently, after a passivation film is deposited, a pad is formed, so that EEPROM is finally obtained.

As described above, in the first embodiment, since the insulating film 18 of the laminated structure is formed, and the hot electrons are injected to the silicon nitride film 16 as a part of the insulating film, the conventional floating gate becomes unnecessary. Therefore, since the voltage applied to the gate electrode is applied to the silicon nitride film as it is, and the coupling ratio can be set to 1, the program voltage can be lowered.

Moreover, since instead of injecting the hot electron from the drain side as in the conventional art, the hot electrons are injected from the source side, the program current is reduced. In case of the virtual ground array type structure, the current consumption can be suppressed. Therefore, it is possible to reduce the current consumption and to enlarge the memory capacitor.

Furthermore, since the hot electron is injected from the source side, the electrons can be trapped in the entire surface of the silicon nitride film; as a result, no threshold voltage fluctuation occurs, and the charge holding properties are enhanced.

Second Embodiment

A second embodiment forms EEPROM having the same structure as that of FIG. 9 by processes which are different from those of FIGS. 11 and 12.

FIGS. 13 to 15 are views showing manufacturing processes of the second embodiment of the virtual ground array type EEPROM. First, as shown in FIG. 13a, an about 600 nm-thick field oxide film 21 is formed in an element separating area on a p-type silicon substrate by the known LOCOS method. A cell area is formed around the field oxide film 21. Subsequently, after the surface of the Si substrate 11 on the cell area is exposed, on the surface, an about 15 nm-thick silicon oxide film 22 is formed by the thermal oxidation method.

Figure 13A:
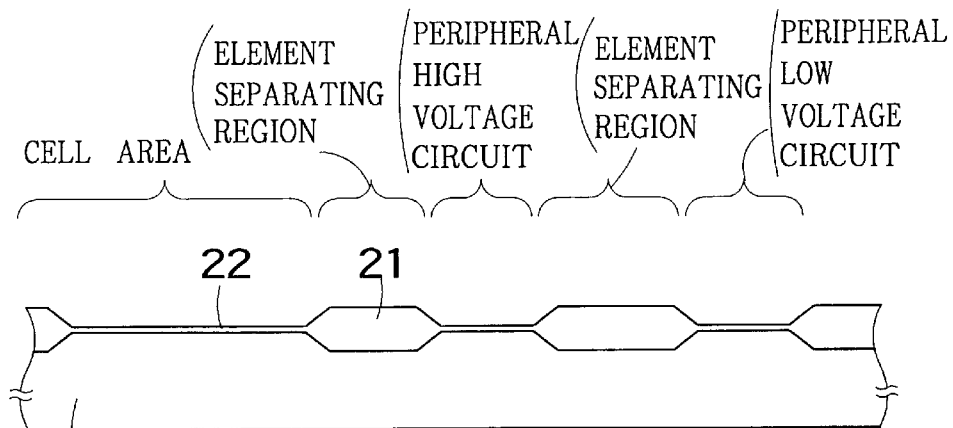
Figure 13B:
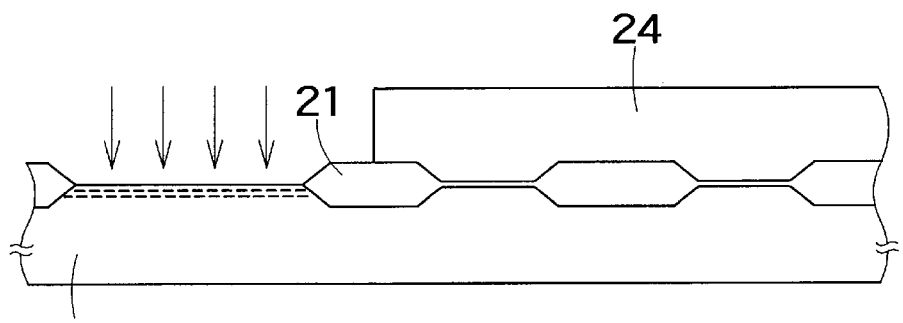

Subsequently, as shown in FIG. 13b, after a resist 24 is formed on the silicon oxide film 22 except the cell area, channel ion injection for controlling the threshold voltages is performed in the cell area. Subsequently, the resist 24 is used as the mask to remove the silicon oxide film by etching using diluted HF, and the silicon substrate surface on the cell area is exposed.

Figure 13C:
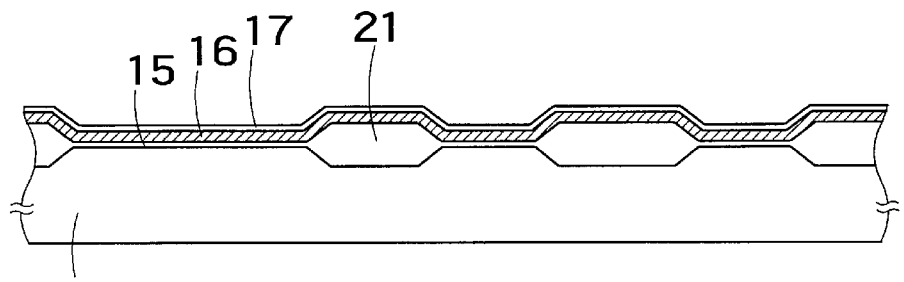
Figure 13D:
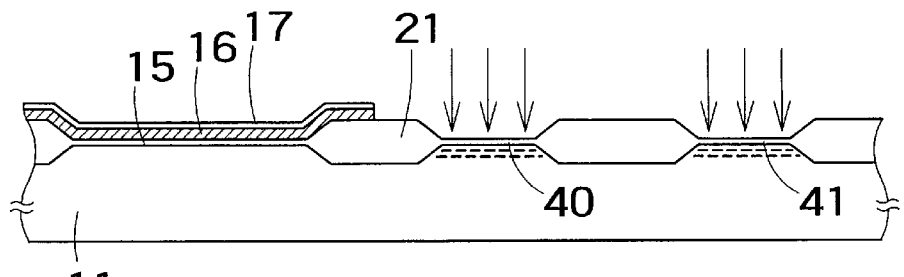

Subsequently, as shown in FIG. 13c, after the resist 24 is removed, a silicon oxide film 15 is formed by the thermal oxidation method. In this case, the silicon oxide film 15 is re-oxidized in a peripheral circuit area. Subsequently, after an about 5 nm-thick silicon nitride film 16 is formed on the silicon oxide film 15, an about 4 nm-thick silicon oxide film 17 is further formed on the upper surface of the silicon nitride film 16 by the thermal oxidation method.

Subsequently, the resist in which the peripheral circuit area is opened is used as the mask to remove the silicon oxide film 15, silicon nitride film 16, and silicon oxide film 17 by etching. Then, after the resist is removed by peeling, a thick silicon oxide film 40 is formed by the thermal oxidation method. Next, channel ion injection is performed to control the threshold voltages of peripheral transistors for high and low voltage circuits.

Figure 14A:
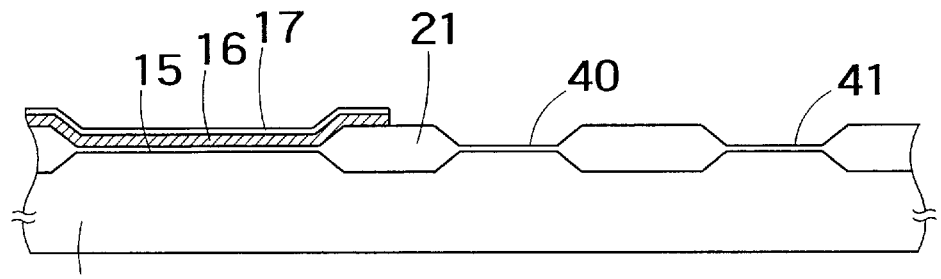

Next, as shown in FIG. 14a, the resist in which a peripheral low voltage circuit area is opened is used as the mask to remove the silicon oxide film 40 by etching. Subsequently, after the resist is removed by peeling, an about 60 angstrom thick silicon oxide film 41 for the low voltage circuit is formed by the thermal oxidation method. At this time, the silicon oxide film 40 for the high voltage circuit is re-oxidized to be in a thickness of about 15 angstroms, but the silicon oxide film 17 on the silicon nitride film 16 in the cell area hardly re-grows.

Figure 14B:
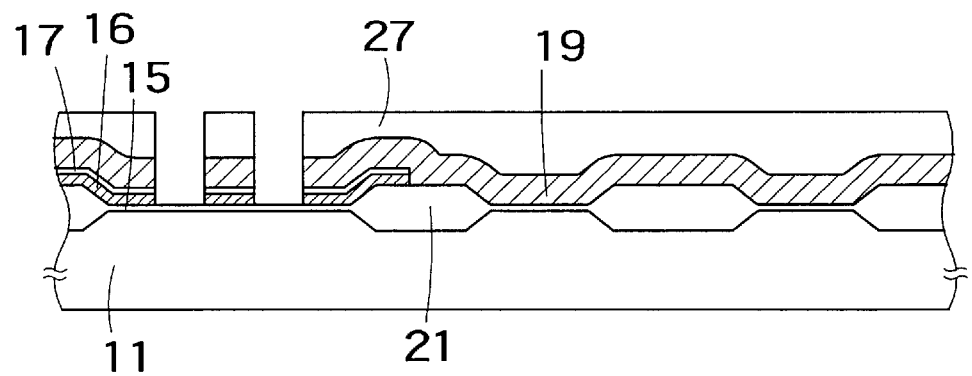

Subsequently, as shown in FIG. 14b, an about 100 nm-thick poly-silicon layer 19 is formed by the CVD method. Next, on the upper surface thereof formed is a resist 27 in which a source/drain area in the cell area is opened. The resist 27 is used as the mask to remove the polysilicon layer 19, silicon oxide film 17, and silicon nitride film 16 by RIE.

Figure 14C:
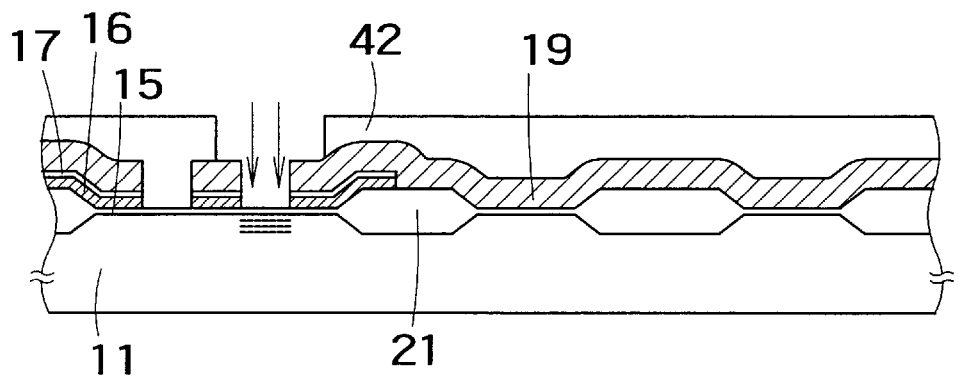

Next, as shown in FIG. 14c, after the resist 27 is removed, a resist 42 in which a drain area in the cell area is opened is formed on the upper surface of the polysilicon layer 19. The poly-silicon layer 19 is then used as the mask to perform ion injection of arsenic of 1E15 with a voltage of 50 KeV. Thereby, the drain diffusion layer 13 of a self align structure for the poly-silicon layer 19 is formed.

Figure 14D:
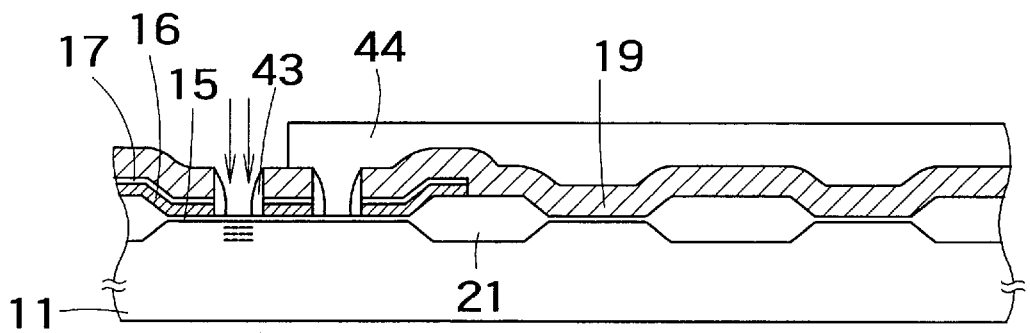

Subsequently, as shown in FIG. 14d, after an about 70 nm-thick silicon oxide film is formed by the CVD method, for example, the silicon oxide film is etched back RIE to form a side wall oxide film 43 on a side wall portion of the poly-silicon layer. Next, after a resist 44 in which the source area in the cell area is opened is formed, the poly-silicon layer 19 and side wall oxide film 43 are used as the masks to inject the arsenic ion of 1E15 with the voltage of 50 KeV. Thereby, the source diffusion layer 12 which has a self align structure for the poly-silicon layer 19 and has the offset area 11 with a space width equal to that of the side wall oxide film 43 is formed.

Next, as shown in FIG. 15a, an about 400 nm-thick silicon oxide film 10 is formed by the CVD method. That is, by etching back the silicon oxide film 10, the silicon oxide film 10 is embedded in poly-silicon openings of the source diffusion layer 12 and the drain diffusion layer 13, and additionally the upper surface of the poly-silicon layer 19 is exposed. Subsequently, each of the polysilicon layer 28 and the WSi layer 29 is formed in a thickness of about 100 nm by the CVD method.

Subsequently, as shown in FIG. 15b, after the resist pattern 30 of the word line in the cell area is formed, the resist 30 is used as the mask to etch the WSi layer 29, poly-silicon layer 28, poly-silicon layer 19, silicon oxide film 17 and silicon nitride film 16 by RIE.

Next, in the same manner as the first embodiment, the source/drain diffusion layers of the peripheral transistors, a BPSG film as the interlayer film, the wiring area, the passivation film, and the pad are formed, so that EEPROM is finally obtained.

FIG. 16 is a view showing a sectional structure of the cell area formed by the processes of FIGS. 13 to 15. As shown in the drawing, in the structure of the second embodiment, source terminals or drain terminals of adjacent transistors are opposed to each other. Additionally, also in the second embodiment, the source and drain are reversed during data writing and reading.

Third Embodiment

Figure 17:
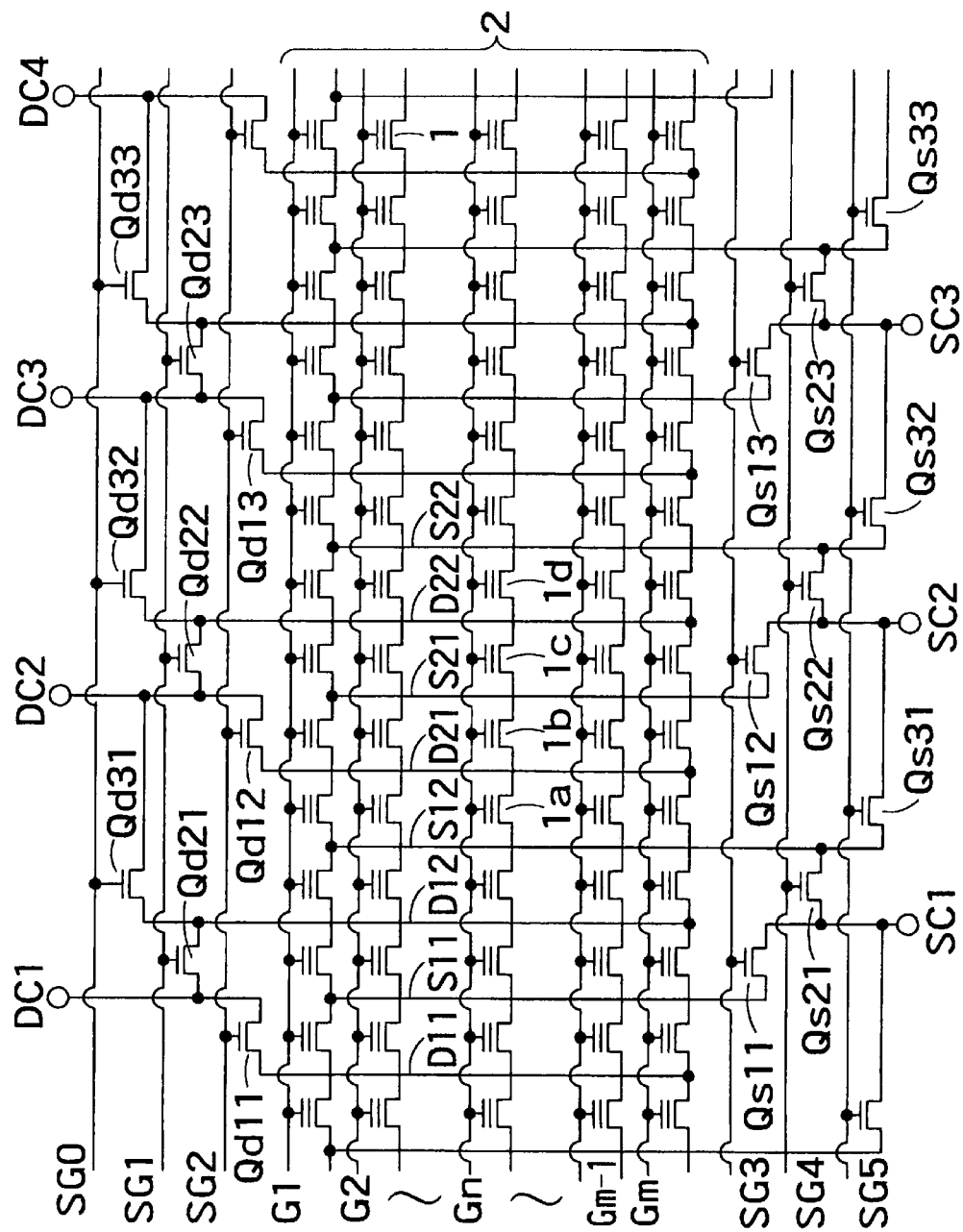
FIG. 17 is an equivalent circuit diagram of one embodiment of NOR type EPROM of a virtual ground array system.

FIG. 17 is an equivalent circuit diagram showing one embodiment of NOR type EPROM constituted by the virtual ground array. In the same manner as in FIG. 3, the EPROM of FIG. 17 has a memory cell array 2 of a plurality of memory cells 1 arranged in a matrix manner, and control gates in the memory cells 1 of the same row are connected in common to constitute word lines G1 to Gm. Moreover, sources of the memory cells 1 adjacent to each other in the column direction are connected in common to constitute source lines S11 to Sn2, and drains of the memory cells 1 adjacent to each other likewise in the column direction are connected in common to constitute drain lines D11 to Dn2. These source lines S11 to Sn2 and drain lines D11 to Dn2 are alternately arranged in the column direction.

In the same manner as the conventional EPROM shown in FIG. 3, the EPROM of FIG. 17 sets voltages of the source lines S11 to Sn2 by first and second source line selecting transistors Qs11 to Qs1n, Qs21 to Qs2n, and sets voltages of the drain lines by first and second drain line selecting transistors Qd11 to Qd1n, Qd21 to Qd2n.

Moreover, in the EPROM of FIG. 17, different from the conventional EPROM shown in FIG. 3 in which two selection gate lines (SG1, SG2) or (SG3, SG4) are provided in upper and lower direction of the memory cell array 2, respectively, another selection gate line SG0 or SG5 is provided in the upper and lower directions. Furthermore, third source line selecting transistors Qs31 to Qs3n and third drain line selecting transistors Qd31 to Qd3n are provided for the newly added selection gate lines SG0 and SG5.

The first to third source line selecting transistors (Qs11, Qs21, Qs31), . . . , (Qs1n, Qs2n, Qs3n) form sets, and the first to third drain line selecting transistors (Qd11, Qd21, Qd31), . . . , (Qd1n, Qd2n, Qd3n) are provided for the sets.

A source terminal of the first source line selecting transistor Qs12 shown in FIG. 17 is connected to the source line S21, and the adjacent source line S22 is connected to source terminals of the second and third source line selecting transistors Qs22 and Qs23. Drain terminals of the first and second source line selecting transistors Qs12 and Qs22 are connected to the corresponding source contact SC2. Moreover, a drain terminal of the third source line selecting transistor Qs32 is connected to a source contact SC3 adjacent to the source contact SC2.

Similarly, a source terminal of the first drain line selecting transistor Qd12 is connected to the drain line D21, and the adjacent drain line D22 is connected to source terminals of the second and third drain line selecting transistors Qd22 and Qd32. Drain terminals of the first and second drain line selecting transistors Qd12, Qd22 are connected to the corresponding drain contact DC2. Moreover, a drain terminal of the third drain line selecting transistor Qd32 is connected to a drain contact DC3 adjacent to the drain contact DC2.

FIG. 18 is a diagram explaining a method of setting a voltage when data is written to the EPROM of FIG. 17, and shows an example in which data is written to the memory cells 1a to 1d of FIG. 17. For example, when data is written to the memory cell 1b, the selection gates SG1 and SG5 are set to the ground voltage Vss, the other selection gates are set to the power supply voltage Vdd, the gate line Gn connected to the memory cell 1b is set to a voltage Vpg which is higher than the power supply voltage Vdd, the other gate lines are set to the ground voltage Vss, the source contacts SC2, SC3 and drain contact DC3 are set to the ground voltage Vss, and the other source contacts and drain contacts are set to the voltage Vpd which is higher than the power supply voltage Vdd.

Thereby, the drain line D21 connected to the drain terminal of the memory cell 1b reaches the voltage Vpd, the source line S21 connected to the source terminal of the memory cell 1b reaches the ground voltage Vss, and the electron is injected to the floating gate of the memory cell 1b to write data.

Moreover, at this time, since all source and drain lines arranged on the right side from the source line S21 reach the ground voltage Vss, and all source and drain lines arranged on the left side from the drain line D21 reach the voltage Vpd, the source and drain lines are not placed in floating states, and there is no possibility that data is wrongly written to the memory cells 1 other than the memory cell 1b.

More specifically, when data is written to the memory cell 1b, the selection gate line SG1 is set to the ground voltage Vss. Therefore, the second drain line selecting transistor Qd22 turns off. In the conventional circuit, when the second drain line selecting transistor Qd22 turns off, the drain line D22 is placed in the floating state. In the circuit of FIG. 17, however, the third drain line selecting transistor Qd32 is connected to the drain line D22, and the transistor Qd32 turns on. Therefore, the drain line D22 becomes the same voltage as that of the drain contact DC3, and is prevented from being in the floating state.

The same can also be applied to the source line. By arranging the third source line selecting transistors Qs31 to Qs3n, all the source lines are set to either the voltage Vpd or the ground voltage Vss.

As described above, in the circuit of FIG. 17, one source line of the adjacent two source lines is connected to the second and third source line selecting transistors, and one of these transistors is surely turned on. Additionally, one drain line of the adjacent two drain lines is connected to the second and third drain line selecting transistors, and one of these transistors is surely turned on. Therefore, even when data is written to any one of the memory cells 1, the source and drain lines are not placed in floating states.

Figure 19:
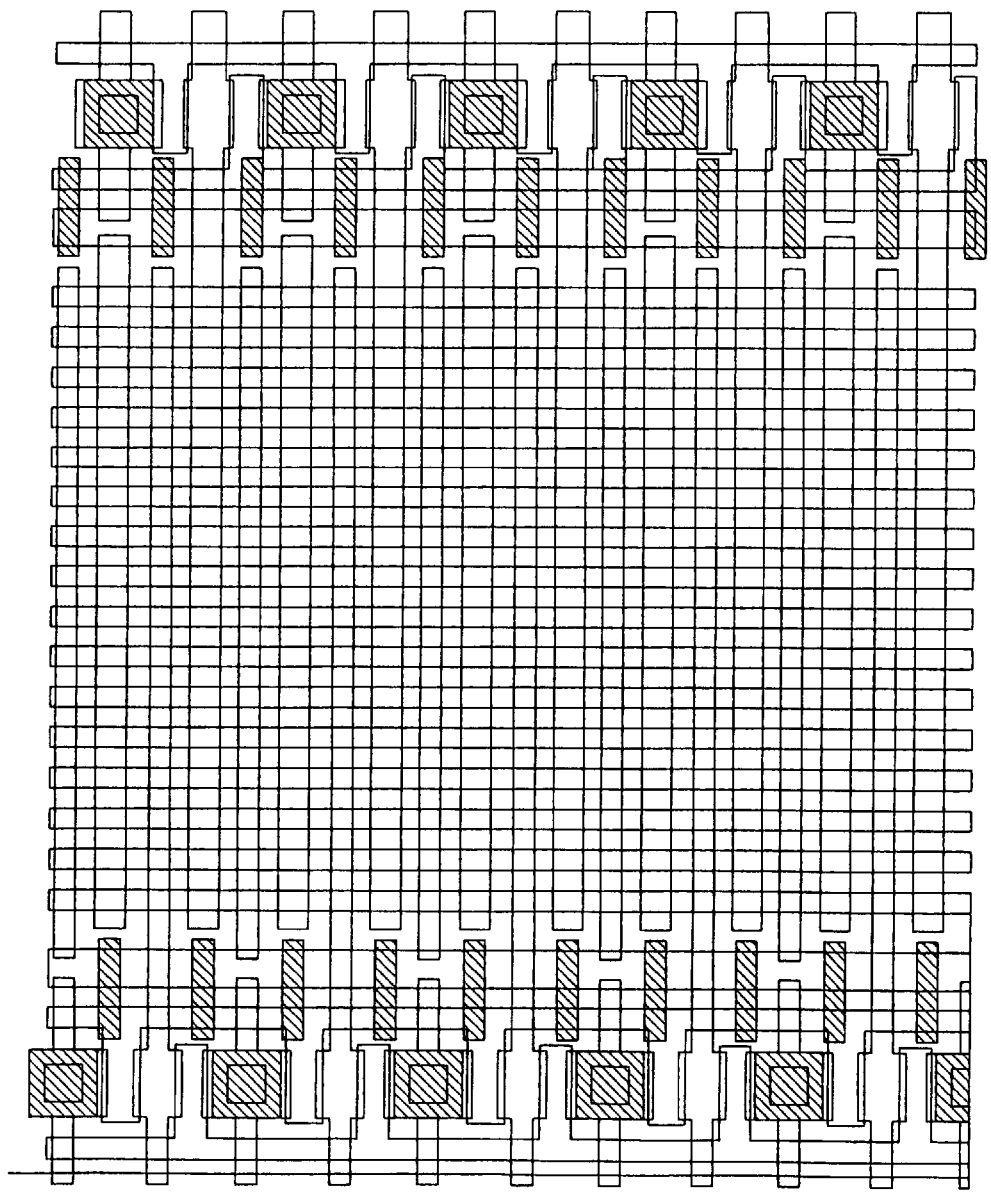

FIG. 19 is a pattern layout diagram of the EPROM of FIG. 1. A pattern layout is not limited to FIG. 19 and, for example, a pattern layout as shown in FIG. 20 can be employed.

Additionally, in the memory cell 1 in which the source and drain terminals can be reversed for use, as described above, the selection gate lines SG0 and SG5 have to be added to both a source contact side and a drain contact side. However, when the reversed source and drain terminals cannot be reversed for structural reasons of the memory cell 1, the selection gate line SG0 and third drain line selecting transistors Qd31 to Qd3n on the drain contact side can be omitted, and the circuit configuration can be simpler than that of FIG. 1.

In FIG. 17, the example of NOR type EPROM has been described, but EEPROM can also be realized with the similar circuit configuration.

Fourth Embodiment

FIG. 21 is a view showing a sectional structure of a fourth embodiment of the semiconductor memory device according to the present invention, and shows the structure of one memory cell of EEPROM. In the EEPROM of FIG. 21, source side injection is performed. FIG. 21a is a view showing a basic structure, and FIG. 21b is a view explaining a principle to write data.

The EEPROM of FIG. 21 is provided with a memory cell transistor 72 and a selecting transistor 73 which are formed adjacent to each other on a semiconductor substrate 71, and the memory cell transistor 72 has a laminated film 77 constituted of a silicon oxide film 74, a silicon nitride film 75 and a silicon oxide film 76, and a control gate 78 formed on the upper surface of the film. The selecting transistor 73 has a selection gate 79.

In the EEPROM of FIG. 21, instead of the floating gate constituted of poly-silicon or the like, the silicon nitride film 75 in the laminated film 77 is used as a charge accumulating layer. Accurately, the silicon nitride film 75 itself, and a vicinity of an interface of the silicon nitride film 75 and the lower silicon oxide film 74 are used as the charge accumulating layers.

In the conventional art, since the electrons are injected into the floating gate, the voltage of the floating gate has to be raised. For example, by enlarging the surface area of the floating gate, the coupling with the control gate 78 is strengthened. On the other hand, since the laminated film 77 of FIG. 21 is formed of an insulating material, the film can be thinned, and a sufficient electric field can be supplied to the lowest film 74 of the laminated film 77 with a low control gate voltage. Therefore, as compared with the conventional floating gate type, the surface area of the laminated film 77 can be reduced, and the cell size can be minimized.

Moreover, the electrons taken into the silicon nitride film 75 move less in the film as compared with the electrons taken into the floating gate formed of polysilicon or the like. At this time, by the injected electrons, the voltage of the laminated film 77 is gradually lowered from the source side, and the extended depletion layer is gradually moved toward the drain side. Therefore, the source side injection can be performed more efficiently.

Figure 22:
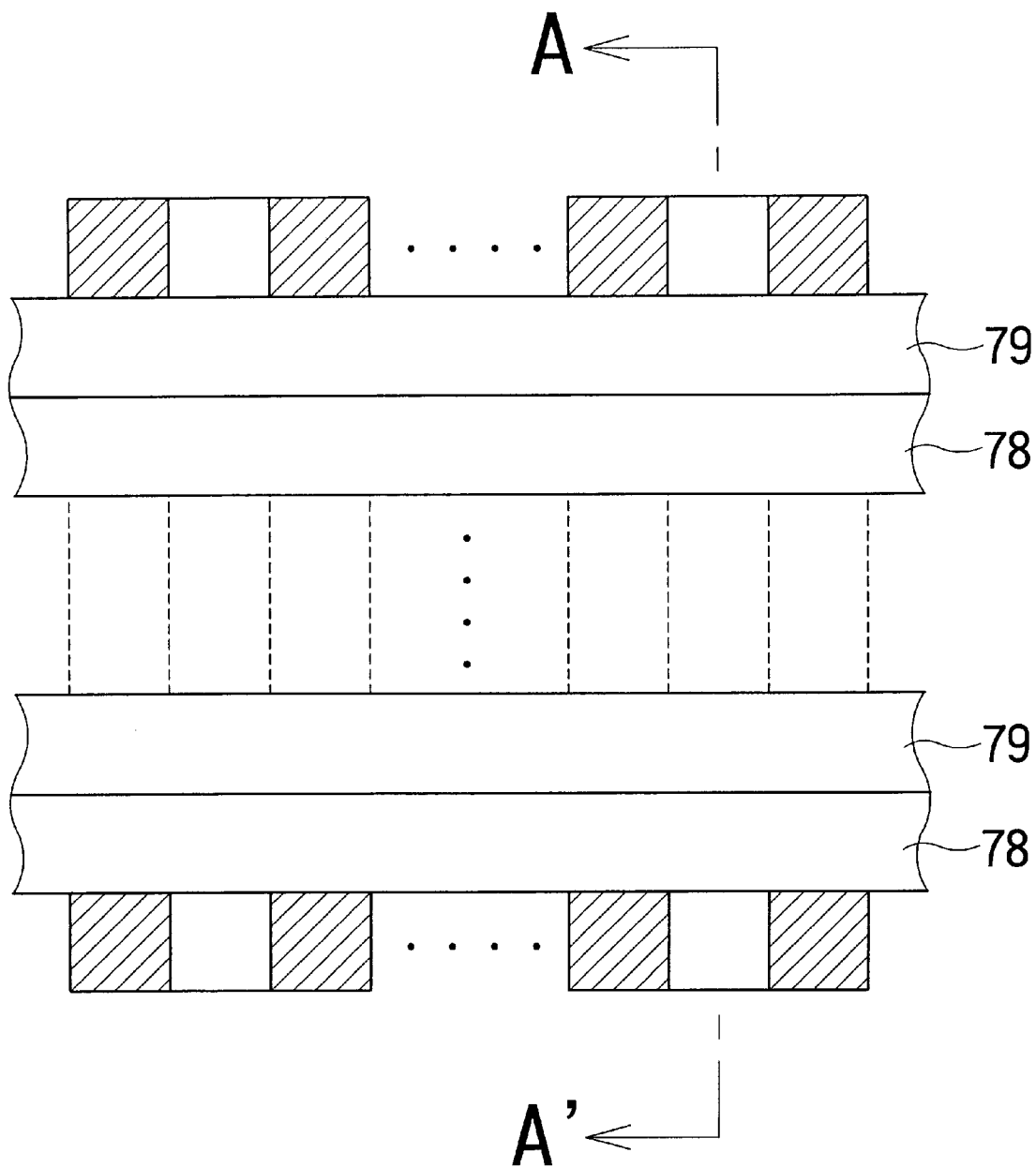
FIG. 22 is a layout diagram of the EEPROM of FIG. 1.

FIG. 22 is a layout diagram of EEPROM of FIG. 21, and FIGS. 23 and 24 are views showing manufacturing processes of the EEPROM of FIG. 21. FIGS. 23 and 24 are sectional views taken along line A-A' of FIG. 22. The manufacturing processes of the EEPROM of FIG. 21 will briefly be described based on these drawings. First, as shown in FIG. 23a, after phosphorus ions are injected into a cell forming area on the p-type silicon substrate 71 to form a depletion region (shown by a dotted line of the drawing), the silicon oxide film 74 is formed on a substrate surface. Subsequently, as shown in FIG. 23b, the silicon nitride film 75 and the silicon oxide film 76 are sequentially formed on the upper surface of the silicon oxide film 74. That is, the laminated film 77 is formed of the silicon oxide film 74, the silicon nitride film, and the silicon oxide film 74.

Figure 24A:
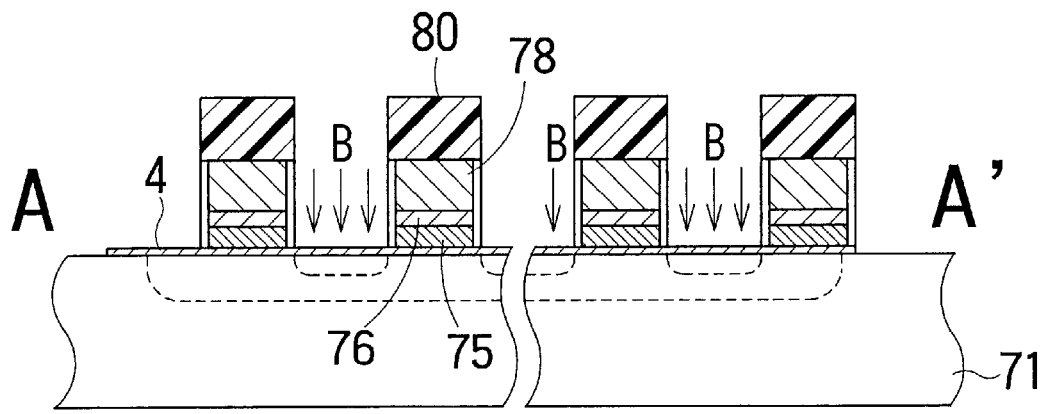

Subsequently, as shown in FIG. 23c, on the upper surface of the silicon oxide film 76 formed is a polysilicon layer which is a wiring material for the control gate 78. Next, as shown in FIG. 24a, after a photoresist film 80 is formed on the upper surface of the poly-silicon layer, by RIE method the poly-silicon layer, the silicon oxide film 76 and the silicon nitride film 75 in a portion the selecting transistor 73 is formed are removed by RIE. Subsequently, by injecting boron ions from above of the exposed silicon oxide film 74, and an enhancement region is formed in the vicinity of the substrate surface in the portions, and then the silicon oxide film 74 and the photoresist film 80 are removed.

Figure 24B:
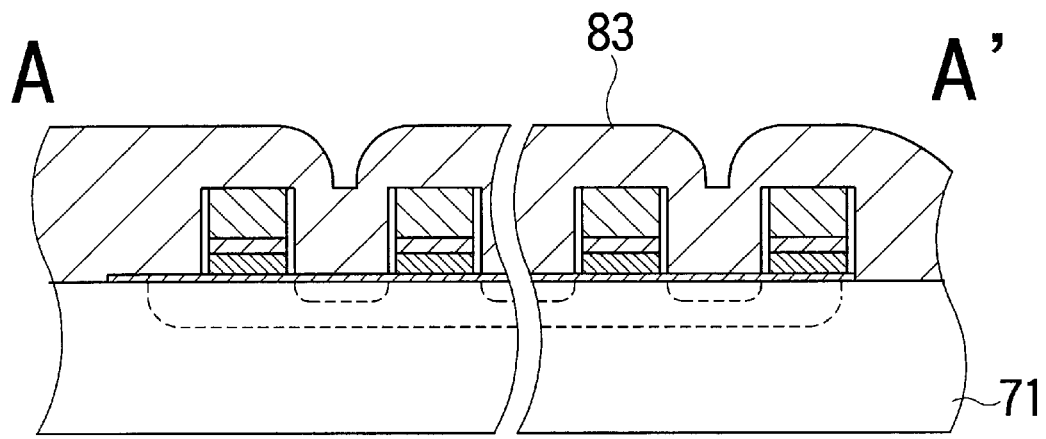
Figure 24C:
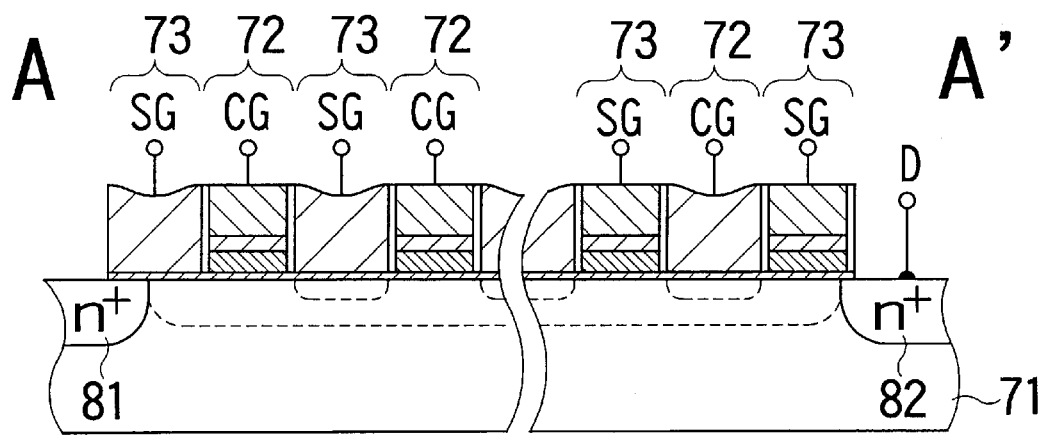

Next, the silicon oxide film 74 is formed on the upper surface of the substrate. Next, as shown in FIG. 24b, a poly-silicon layer 83 as an electrode material of the selection gate 79 is formed on the upper surface of the silicon oxide film 74. And then, as shown in FIG. 24c, a part of the poly-silicon layer 83 is removed to from the selection gate electrode 73. Thereby, the selecting transistor 73 is formed adjacent to the memory cell transistor 72. Moreover, phosphorus and other impurity ions are injected to form a source area 81 and a drain area 82. Thereafter, bit lines and word lines (not shown) are formed, and the memory cell transistors 72 are connected by NAND logic.

Figure 26:
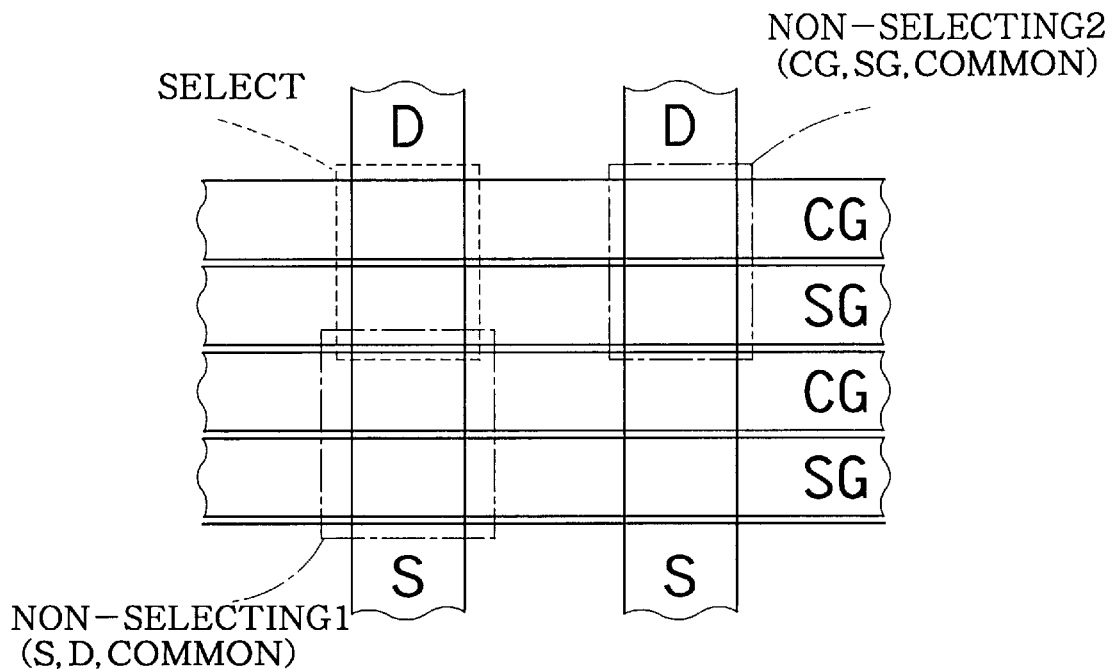
FIG. 26 is a diagrammatic layout view of the EEPROM of FIG. 21.
Figure 27:
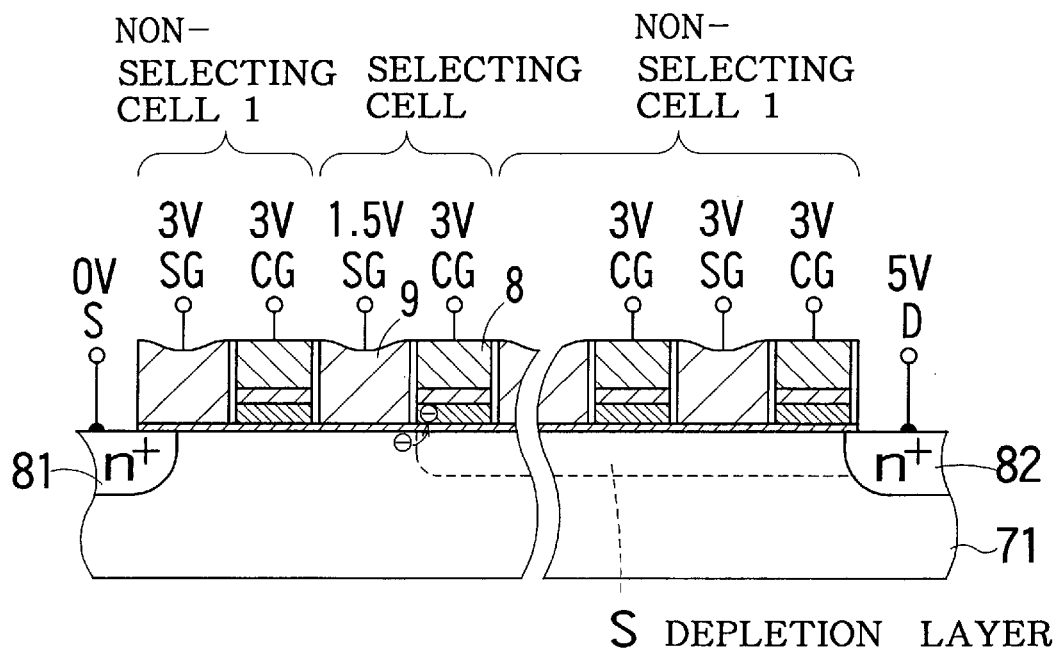
FIG. 27 is a sectional view of the EEPROM of FIG. 21.

FIG. 25 is a diagram showing voltages applied to electrodes of the EEPROM having NAND constitution shown in FIG. 21, FIG. 26 is a schematic layout view of the EEPROM of FIG. 21, and FIG. 27 is a sectional view of the EEPROM of FIG. 21. The operation of the EEPROM of FIG. 21 will be described hereinafter with reference to FIGS. 25 to 27.

The EEPROM of FIG. 21 determines whether the data is "0" or "1", based on whether or not the electrons are injected to the silicon nitride film 75, or to the vicinity of the interface of the silicon nitride film 75 and silicon oxide film 74. When the electrons are injected to the silicon nitride film 75, drain electrode D of the selected memory cell 1 (hereinafter referred to as the selected cell) is set to 5 V, source electrode S is set to 0 V, control gate (CG) 8 is set to 3 V, and selection gate (SG) 9 is set to 1.5 V.

In the EEPROM having the NAND constitution, as shown in FIG. 26, there are provided a non-selected cell which has the drain electrode D and source electrode S in common with the selected cell (hereinafter referred to as non-selected cell 1), and a non-selected cell having the control gate (CG) 8 and selection gate (SG) 9 in common with the selected cell (hereinafter referred to as non-selected cell 2). As shown in FIG. 27, the non-selected cells 1 are formed adjacent to each other between the drain electrode D and the source electrode S.

When writing data to the selected cell, the drain electrode D of the non-selected cell 1 is set to 5 V, the selection gate (SG) 9 and control gate (CG) 8 are set to 3 V, and the source electrode S is set to 0 V. The drain electrode D and source electrode S of the non-selected cell 2 are set to 0 V, the selection gate SG is set to 1.5 V, and the control gate CG is set to 3 V.

Thereby, as shown in FIG. 27, the depletion layer S of the selecting cell is extended toward the source area 81 from the drain area 82. Here, when the selection gate 79 is set to a voltage slightly higher than the threshold voltage, for example, 1.5 V, as shown in FIG. 21b, an electron, which has flown toward the control gate 78 from the selection gate 79, flows along an end of the depletion layer S, and is injected to a left end portion of the silicon nitride film 75. When the electron is injected into the silicon nitride film 75, the depletion layer S accordingly shrinks, the electron to be injected next moves toward the right side (drain side) from the previously injected position, and the depletion layer S further shrinks.

Thereafter, the electron is likewise injected constantly along the end of the depletion layer S into the silicon nitride film 75, and as a result, the electrons can be injected to the entire surface of the silicon nitride film 75.

On the other hand, when data is read, the drain electrode D of the selected cell is set to 1.5 V, the source electrode S and the control gate 78 are set to 0 V, and the selection gate 79 is set to 3 V. Moreover, the drain electrode D of the non-selected cell 1 is set to 1.5 V, the source electrode is set to 0 V, and the selection gate SG and the control gate CG are set to 3 V. Furthermore, the drain electrode D and the source electrode S of the non-selected cell 2 are set to 0 V, the selection gate 79 is set to 3 V, and the control gate is set to 0V.

Thereby, the selected cell can determine whether the data is "0" or "1", based on whether or not current flows between drain and source. More specifically, when the electrons are injected to the silicon nitride film 75, the threshold voltage increases, and no current flows between drain and source. Conversely, when no electron is injected into the silicon nitride film 75, the current flows between drain and source.

As described above, in the EEPROM of the fourth embodiment, instead of the floating gate, the laminated film 77 formed of the silicon oxide film 74, silicon nitride film 75 and silicon oxide film 76 is formed, and the vicinity of the interface of the silicon nitride film 75 and the silicon oxide film 74 in the laminated film 77 is used as the charge accumulating layer, and the electrons are injected to the charge accumulating layer from the source side. Therefore, it is possible to improve the electron injection efficiency. Moreover, since the source side injection is performed, the voltage applied to the control gate 78 and the like can be set to 10 V or less, and the peripheral transistors do not need to have highly withstanding voltage structures. Therefore, EEPROM structure can be simplified, and costs can be reduced. Furthermore, since substantially the same voltage as that of the control gate 78 is applied to the charge accumulating layer regardless of its size, the size of the charge accumulating layer can be smaller than the conventional floating gate, the cell size can be reduced, and the memory chip capacity can thus be enlarged.

Additionally, in the above embodiments, the examples of NAND type structure have been described, but the present invention can be also applied to memory constitutions other than NAND type.

That is, when the memory is not of NAND type, the non-selected cell 1 of FIG. 26 is not disposed, and a plurality of cells are connected to the same control gate (CG) 8 and selection gate (SG) 9. A sectional view of the structure is shown in FIG. 21a. In this case, when data writing or reading is performed for the selected cell shown by the dotted line of FIG. 26, the same voltages as those shown in FIG. 25 may be applied to the gate electrodes, drain electrode D, and source electrode S.

What is claimed is:

1. A semiconductor memory device comprising:
   a first diffusion layer area and a first channel area formed in contact with each other in a direction substantially parallel to the upper surface of a semiconductor substrate;
   a second channel area formed in contact with said first channel area in the direction substantially parallel to the upper surface of said semiconductor substrate;

a second diffusion layer area formed in contact with said second channel area in the direction substantially parallel to the upper surface of said semiconductor substrate;

a charge accumulating layer of a laminated structure formed on said first channel area;

an insulating layer formed on said charge accumulating layer; and a gate electrode formed on the upper surface of said charge accumulating layer and said insulating layer, a threshold voltage of said first channel area under said gate electrode being set to be higher than a threshold voltage of said second channel area under said gate electrode.

2. The semiconductor memory device according to claim 1, wherein during writing, a first writing voltage is applied to said first diffusion layer area in contact with said first channel area, a reference voltage is applied to said second diffusion layer area in contact with said second channel area, a second writing voltage is applied to said gate electrode, and an electron is injected to said charge accumulating layer from a side of said first channel area close to said second channel area.

3. The semiconductor memory device according to claim 1, wherein during reading, a reference voltage is applied to said first diffusion layer area in contact with said first channel area, a first reading voltage is applied to said second diffusion layer area in contact with said second channel area, a second reading voltage is applied to said gate electrode, and it is determined whether or not an electron is injected to said charge accumulating layer on the base of whether or not a current flows to said first diffusion layer area from said diffusion layer area in contact with said second channel area.

4. The semiconductor memory device according to claim 1, wherein one of said first and second diffusion layer areas acts as a drain electrode during writing, and acts as a source electrode during reading, and the other of said first and second diffusion layer areas acts as the source electrode during writing, and acts as the drain electrode during reading.

5. The semiconductor memory device according to claim 1, wherein an insulating film on said second channel area is formed so as to be thicker than said charge accumulating layer and the insulating film formed on said charge accumulating layer.

6. The semiconductor memory device according to claim 1, further comprising a memory cell array in which memory cells having said first and second diffusion layer areas, said first and second channel areas, said charge accumulating layer, said insulating layer, and said gate electrode are arranged in a row direction and a column direction in a matrix manner, said memory cell array comprising:

a row line to which said gate electrode of each memory cell of the same row is connected in common;

a source line to which source electrode of each memory cell of the same column is connected in common; and a drain line to which drain electrode of each memory cell of the same column is connected in common.

7. The semiconductor memory device according to claim 6, wherein each of said first and second diffusion layer areas is in contact with said first channel area at one end, and is in contact with the second channel area at the other end.

8. The semiconductor memory device according to claim 6, wherein one of said first and second diffusion layer areas is in contact with said first channel area at both ends, and the other of said first and second diffusion layer areas is in contact with said second channel area at both ends.

* * * * *